United States Patent
Kimura et al.

(10) Patent No.: US 11,091,851 B2
(45) Date of Patent: Aug. 17, 2021

(54) APPARATUS PROVIDED WITH A CRUCIBLE INCLUDING A POROUS BAFFLE PLATE THEREIN FOR MANUFACTURING COMPOUND SINGLE CRYSTAL AND METHOD FOR MANUFACTURING COMPOUND SINGLE CRYSTAL

(71) Applicant: KABUSHIKI KAISHA TOYOTA CHUO KENKYUSHO, Nagakute (JP)

(72) Inventors: Taishi Kimura, Nagakute (JP); Daisuke Nakamura, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 135 days.

(21) Appl. No.: 16/344,455

(22) PCT Filed: Feb. 8, 2018

(86) PCT No.: PCT/JP2018/004436
§ 371 (c)(1),
(2) Date: Apr. 24, 2019

(87) PCT Pub. No.: WO2018/147379
PCT Pub. Date: Aug. 16, 2018

(65) Prior Publication Data
US 2019/0330762 A1 Oct. 31, 2019

(30) Foreign Application Priority Data
Feb. 10, 2017 (JP) .............................. JP2017-023660

(51) Int. Cl.
*C30B 23/06* (2006.01)
*C30B 23/00* (2006.01)
(Continued)

(52) U.S. Cl.
CPC ............ *C30B 23/06* (2013.01); *C30B 23/005* (2013.01); *C30B 29/38* (2013.01); *C30B 35/002* (2013.01)

(58) Field of Classification Search
CPC ..... C30B 23/002; C30B 23/005; C30B 23/02; C30B 23/06; C30B 23/063; C30B 23/066;
(Continued)

(56) References Cited

U.S. PATENT DOCUMENTS 6,136,093 A * 10/2000 Shiomi ................. C30B 29/406
117/104
6,436,193 B1 * 8/2002 Kasai .................... C23C 16/455
118/715
(Continued)

FOREIGN PATENT DOCUMENTS

JP  08157295 A  *  6/1996
JP  H08-157295 A     6/1996
(Continued)

OTHER PUBLICATIONS

Lukin, et al. publication entitled "Investigation of GaN layers grown by high temperature vapor phase epitaxy," PHys. Status Solidi C, vol. 11, No. 3-4, pp. 491-494 (2014). (Year: 2014).*
(Continued)

*Primary Examiner* — Kenneth A Bratland, Jr.
(74) *Attorney, Agent, or Firm* — Oliff PLC

(57) ABSTRACT

An apparatus for manufacturing compound single crystal includes a crystal growth section to hold a seed crystal, a gas supply section to supply a metal-contained gas and a reactant gas toward the seed crystal, and a heating section to heat the seed crystal and a metal source. The gas supply section includes a crucible holding the metal source, a carrier gas supply unit, and a reactant gas supply unit. A porous baffle plate is provided in an opening of the crucible. The porous
(Continued)

baffle plate satisfies a relationship of $80\% \leq (1-V_H/V_B) \times 100 < 100\%$ and a relationship of $0.0003 < a^2/L < 1.1$. $V_B$ is an apparent volume of the porous baffle plate, $V_H$ is a total volume of the through-holes contained in the porous baffle plate, "a" is a diameter of the through-hole, and L is a length of the through-hole.

17 Claims, 10 Drawing Sheets

(51) Int. Cl.
    *C30B 29/38*     (2006.01)
    *C30B 35/00*     (2006.01)

(58) Field of Classification Search
CPC ......... C30B 25/00; C30B 25/02; C30B 25/10; C30B 25/12; C30B 25/14; C30B 25/16; C30B 25/165; C30B 29/00; C30B 29/10; C30B 29/38; C30B 29/40; C30B 29/403; C30B 29/406; C30B 35/002; C23C 14/00; C23C 14/06; C23C 14/0617; C23C 14/24; C23C 16/00; C23C 16/22; C23C 16/30; C23C 16/301; C23C 16/303; C23C 16/44; C23C 16/448; C23C 16/4481; C23C 16/455; C23C 16/45563; C23C 16/45565; C23C 16/45551
USPC ....... 117/84, 88, 98–99, 102, 105, 107, 200, 117/204, 937, 952
See application file for complete search history.

(56) References Cited

U.S. PATENT DOCUMENTS

| | | | |
|---|---|---|---|
| 2008/0042160 A1 | 2/2008 | Shibata | |
| 2011/0180213 A1 | 7/2011 | Hirayama et al. | |
| 2012/0329245 A1* | 12/2012 | Uematsu | H01L 21/02389 438/460 |
| 2013/0011677 A1* | 1/2013 | Nambu | C30B 29/406 428/389 |

FOREIGN PATENT DOCUMENTS

| | | | | |
|---|---|---|---|---|
| JP | 2000-290777 A | | 10/2000 | |
| JP | 2002-060297 A | | 2/2002 | |
| JP | 2006-027976 A | | 2/2006 | |
| JP | 2006027976 A | * | 6/2006 | |
| JP | 2007-277089 A | | 10/2007 | |
| JP | 2008-044818 A | | 2/2008 | |
| JP | 2009-302205 A | | 12/2009 | |
| JP | 2013-227202 A | | 11/2013 | |
| JP | 2013227202 A | * | 11/2013 | |
| JP | 2014-073918 A | | 4/2014 | |
| JP | 2014-075606 A | | 4/2014 | |
| JP | 2016-104693 A | | 6/2016 | |
| JP | 2016-128381 A | | 7/2016 | |
| JP | 2017-183583 A | | 10/2017 | |

OTHER PUBLICATIONS

May 28, 2019 Office Action issued in Japanese Patent Application No. 2017-023660.
May 15, 2019 International Preliminary Report on Patentability issued in International Patent Application No. PCT/JP2018/004436.
P.G. Baranov et al. "Current Status of GaN Crystal Growth by Sublimation Sandwich Technique". MRS Internet Journal of Nitride Semiconductor Research, vol. 3, article 50, 1998.
C.M. Balkas et al. "Growth and Characterization of GaN Single Crystals". Journal of Crystal Growth, vol. 208, 2000, pp. 100-106.
Mamoru Imade et al. "Examination of Effects of H2 Concentration in Reactant Gas on GaN Growth by Gallium Hydride Vapor Phase Epitaxy". Japanese Journal of Applied Physics, vol. 45, No. 33, 2006, pp. L878-L880.
H.-J. Rost et al. "Investigations of the Growth Conditions for GaN-Bulk Crystals Grown by the Sublimation Technique". Phys. Stat. Sol., vol. 4, No. 7, 2007, pp. 2219-2222.
G. Lukin et al. "Investigation of GaN Layers Grown by High Temperature Vapor Phase Epitaxy". Phys. Status Solidi. C., vol. 11, No. 3-4, 2014, pp. 491-494.
May 1, 2018 International Search Report issued in International Patent Application No. PCT/JP2018/004436.
May 1, 2018 Written Opinion of the International Searching Authority issued in International Patent Application No. PCT/JP2018/004436.
Feb. 19, 2019 Written Opinion of the International Preliminary Examining Authority issued in International Patent Application No. PCT/JP2018/004436.
Apr. 2, 2019 Office Action issued in Japanese Patent Application No. 2017-023660.
May 28, 2019 International Search Report issued in International Patent Application No. PCT/JP2019/006058.
May 28, 2019 Written Opinion issued in International Patent Application No. PCT/JP2019/006058.
Jun. 30, 2020 Office Action issued in Japanese Patent Application No. 2018-046361.
Sep. 15, 2020 International Preliminary Report on Patentability issued in International Patent Application No. PCT/JP2019/006058.
U.S. Appl. No. 16/962,922, filed Jul. 17, 2020 in the name of Taishi Kimura et al.

* cited by examiner

SEED CRYSTAL SIDE

RAW MATERIAL SIDE

SEED CRYSTAL SIDE

RAW MATERIAL SIDE

SEED CRYSTAL SIDE

RAW MATERIAL SIDE

SEED CRYSTAL SIDE

RAW MATERIAL SIDE

APPARATUS PROVIDED WITH A CRUCIBLE INCLUDING A POROUS BAFFLE PLATE THEREIN FOR MANUFACTURING COMPOUND SINGLE CRYSTAL AND METHOD FOR MANUFACTURING COMPOUND SINGLE CRYSTAL

FIELD OF THE INVENTION

The present invention relates to an apparatus for manufacturing a compound single crystal, a method for manufacturing a compound single crystal, and GaN single crystal. More specifically, the invention relates to an apparatus for manufacturing a compound single crystal, which allows a single crystal including an inorganic compound to be grown on a surface of a seed crystal using a metal-contained gas (a gas containing a metal vapor) and a reactant gas, a method for manufacturing a compound single crystal using the apparatus, and a GaN single crystal produced by such a method.

BACKGROUND OF THE INVENTION

A bulk single crystal including an inorganic compound (GaAs, InP, oxide, etc.) is often industrially manufactured by solidification from a congruent melt (Czochralski method or Bridgman method). However, any inorganic compound does not always have a congruent melt in an industrially achievable range of temperature and pressure. In such a case, a flux method or a vapor deposition method is used.

The compound single crystal is composed of two or more elements. Vapor deposition of the compound single crystal is achieved by supplying gas species containing the respective elements onto a seed crystal surface (or grown-crystal surface) and reacting the gas species together on that surface. Halides or organo-metallic compounds are often used as the gas species containing the elements for such vapor deposition. For such gas species, however, apparatus cost is high due to concerns about safety, and material cost itself is also high, leading to high manufacturing cost of the compound single crystal.

To solve such a problem, there is provided a method (hereinafter, referred to as "vapor phase epitaxy method"), in which a gas is generated through vaporization of molten metal, or sublimation or decomposition of an inorganic compound, and a produced metal vapor or a sublimated gas is reacted with a reactant gas on a surface of a seed crystal, and thus a single crystal or polycrystal of an inorganic compound is grown on the surface of the seed crystal.

For example, Non-patent Literature 1 discloses a method for growing a GaN crystal on a substrate surface using the sublimation sandwich technique.

Non-patent Literature 2 discloses a method for growing a GaN single crystal on a substrate surface by subliming cold-formed GaN pellets or vaporizing Ga metal in an ammonia atmosphere.

Non-patent Literature 3 discloses a method for growing a GaN single crystal on a substrate surface using a gallium hydride vapor phase epitaxy (GaH-VPE) method.

Non-patent Literature 4 discloses a method for growing a thick film of a GaN polycrystal on a substrate surface under a nitrogen atmosphere using a vapor phase epitaxy method without using halogen.

Non-patent Literature 5 discloses a method for growing a GaN single crystal on a substrate surface using a vapor phase epitaxy method without using halogen (growth rate: 1.6 to 7.2 µm/h).

In the vapor phase epitaxy method, a metal (for example, Al, Ga, Zn, In, Cd, Hg, Si, Ge, Sn, Mg, Mn, Cu, or Ag) in a liquid or solid state at a normal temperature or a metal compound is used as a metal source. A hydride gas (for example, $H_2O$, a hydrocarbon gas, $NH_3$, $H_2S$, $H_2Se$, $H_2Te$, $PH_3$, or $AsH_3$) or a diatomic molecule gas (for example, $O_2$ or $N_2$) is used as a reactant gas.

Since most of such metal sources and reactant gases are relatively easy in handling and inexpensive, using such types of materials makes it possible to reduce manufacturing cost of the compound single crystal. However, there is substantially no case of achieving stable growth of a bulk single crystal using a combination of such types of materials.

CITATION LIST

Non-Patent Literature

[Non-patent Literature 1]: P. G. Baranov et al., MRS intenet J. Nitride Semicond. Res., Vol. 3(1998)50

[Non-patent Literature 2]: C. M. Balkas et al., J. Cryst. Growth, Vol. 208(2000) pp. 100-106

[Non-patent Literature 3]: M. Imade et al., Jpn. J. Appl. Phys., Vol. 45(2006) pp. L878-L880

[Non-patent Literature 4]: H.-J. Rost et al., Phys. Stat. Sol., Vol. 4(2007) pp. 2219-2222

[Non-patent Literature 5]: G. Lukin et al., Pys. Status Solidi C 11, No. 3-4, 491-494(2014)

SUMMARY OF THE INVENTION

A problem to be solved by the invention is to provide an apparatus for manufacturing a compound single crystal capable of growing a single crystal including an inorganic compound on a surface of a seed crystal over a long time using a metal-contained gas and a reactant gas.

Another problem to be solved by the invention is to provide an apparatus for manufacturing a compound single crystal capable of reducing manufacturing cost of the compound single crystal and increasing crystal size.

Another problem to be solved by the invention is to provide a method for manufacturing a compound single crystal using such an apparatus for manufacturing a compound single crystal.

Another problem to be solved by the invention is to provide a GaN single crystal having a lower impurity concentration than existing compound single crystals.

To solve the above-described problems, an apparatus for manufacturing a compound single crystal according to the invention is summarized by having the following configuration.

(1) The apparatus includes:

a crystal growth section having a susceptor to hold a seed crystal;

a gas supply section to supply a metal-contained gas (a gas containing a metal vapor) generated from a metal source and a reactant gas, which reacts with the metal-contained gas to form an inorganic compound, toward the seed crystal; and a heating section having a heating unit to heat the seed crystal and the metal source.

(2) The gas supply section includes:

a crucible disposed separately from the susceptor and holding the metal source;

a carrier gas supply unit that supplies a carrier gas into the crucible, and supplies a mixed gas of the metal-contained gas and the carrier gas toward the seed crystal; and a reactant gas supply unit to supply the reactant gas toward the seed crystal.

(3) A porous baffle plate is provided in an opening of the crucible.

(4) The porous baffle plate satisfies Expressions (1) and (2).

$$80\% \leq (1 - V_H/V_B) \times 100 < 100\% \qquad (1)$$

$$0.0003 < a^2/L < 1.1 \qquad (2)$$

where $V_B$ is an apparent volume of the porous baffle plate, $V_H$ is a total volume of through-holes contained in the porous baffle plate, "a" is a diameter of the through-hole, and L is a length of the through-hole.

The crucible preferably has a relative density of 99% or more or an average pore size of 100 μm or more.

The crucible preferably includes:

(a) an inner crucible to hold the metal source, and an outer crucible to accommodate the inner crucible;

(b) a carrier gas channel provided between an outer wall surface of the inner crucible and an inner wall surface of the outer crucible so as to flow the carrier gas toward the inside of the inner crucible; and (c) a carrier gas inlet provided in the bottom surface or the side surface of the outer crucible so as to introduce the carrier gas into the carrier gas channel.

The crucible may be a stacked crucible including a first crucible, a second crucible, . . . , and an n-th crucible (n≥2) stacked upward in this order, in which the opening of a k-th crucible (1≤k≤n−1) is coupled to the carrier gas inlet of a (k+1)-th crucible, and the porous baffle plate is provided at least in the opening of the uppermost n-th crucible.

A first method for manufacturing a compound single crystal according to the invention is summarized in that the apparatus for manufacturing the compound single crystal according to the invention is used to grow a single crystal including the inorganic compound on the surface of the seed crystal under a condition where the temperature of each section satisfies Expression (10).

$$T_G < T_D < T_S < T_B \qquad (10)$$

where $T_G$ is a growth temperature, $T_S$ is the temperature of the metal source, $T_D$ is the decomposition temperature of the inorganic compound, and $T_B$ is the temperature of the porous baffle plate provided in the opening of the crucible.

A second method for manufacturing a compound single crystal according to the invention is summarized in that the apparatus for manufacturing the compound single crystal according to the invention is used to grow a single crystal including the inorganic compound on the surface of the seed crystal under a condition where the temperature of each section satisfies Expressions (11) and (12).

$$T_G < T_D \leq T_{Dmax} < T_{Sn} < T_B \qquad (11)$$

$$T_{SK} \leq T_{SK+1} \; (1 \leq k \leq n-1) \qquad (12)$$

where $T_G$ is a growth temperature, $T_{Sn}$ is the temperature of an n-th metal source packed in the n-th crucible, $T_D$ is the decomposition temperature of the inorganic compound, $T_{Dmax}$ is a maximum of the decomposition temperature of the inorganic compound formed from any one of the metal elements contained in the first to n-th metal sources and the reactant gas, $T_{Sk}$ is the temperature of a k-th metal source packed in the k-th crucible, $T_{Sk+1}$ is the temperature of a (k+1)-th metal source packed in the (k+1)-th crucible, and $T_B$ is the temperature of the porous baffle plate provided in the opening of the n-th crucible.

A GaN single crystal according to the invention is summarized by having a C impurity amount of less than $8 \times 10^{15}$ cm$^{-3}$, an H impurity amount of less than $3 \times 10^{16}$ cm$^{-3}$, and an O impurity amount of less than $6 \times 10^5$ cm$^{-3}$.

To achieve good crystal growth using a vapor phase epitaxy method, it is necessary that the metal vapor or the sublimated gas reaches a growth surface in an atomic or molecular state and is reacted with the reactant gas on the growth surface. However, it is in general difficult to stably grow a bulk single crystal in such a method. The major reasons for this are probably as follows:

(a) compound powder is formed in a vapor phase by a vapor phase reaction;

(b) metal is liquified or solidified in a vapor phase, on a growing crystal surface, or on another structural component; and (c) a passive film is formed on the surface of the metal source through a direct reaction of the reactant gas with the metal source in the crucible, or a bumping phenomenon occurs through a drastic reaction so that supply of the metal vapor or the sublimated gas becomes unstable.

On the other hand, in a case of crystal growth using the vapor phase epitaxy method without using halogen according to the invention, the porous baffle plate is provided in the opening of the crucible filled with the metal source, and the carrier gas is flowed into the crucible, and thus the mixed gas is discharged from the crucible while backflow of the reactant gas into the crucible is suppressed. This stabilizes supply of the metal-contained gas.

In growth of the single crystal, optimizing the temperature of each section makes it possible to suppress formation of the compound powder in the vapor phase, or suppress liquidation or solidification of the metal at an unintended site. It is therefore possible to reduce manufacturing cost of the compound single crystal or increase crystal size.

Furthermore, optimizing a shape of the porous baffle plate makes it possible to stably grow the crystal even if the outlet gas flow rate is less than 20 m/sec. In addition, optimizing relative density or average pore size of the crucible makes it possible to prevent a liquid metal from creeping up a crucible wall surface when the liquid metal is used as the metal source. Use of such an apparatus provides a GaN single crystal having extremely low concentrations of C, H, and O impurities.

DETAILED DESCRIPTION OF THE PREFERRED EMBODIMENTS

Hereinafter, some embodiments of the invention will be described in detail.

[1. Apparatus for Manufacturing Compound Single Crystal (1)]

Figure 1:
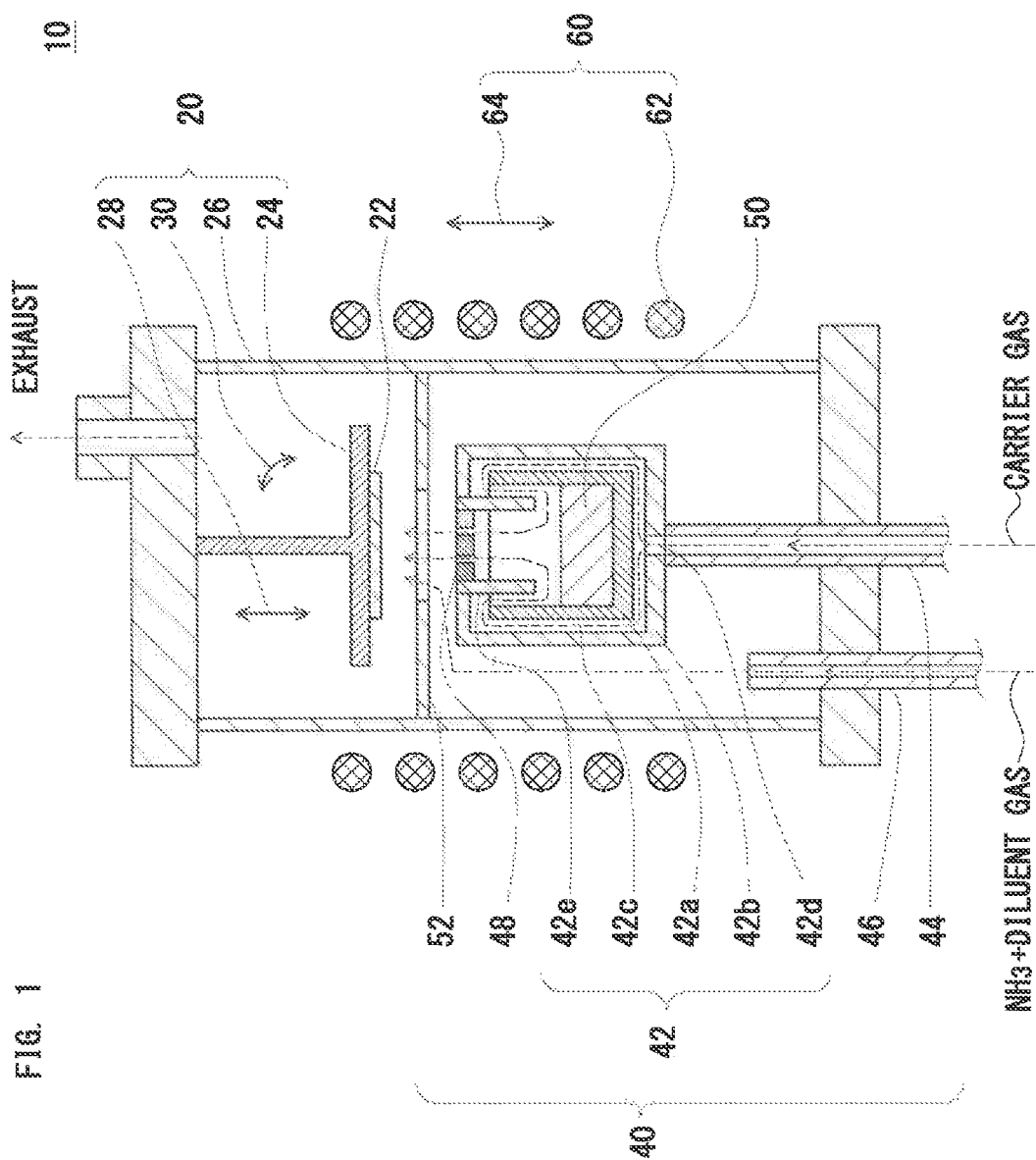
FIG. 1 is a schematic sectional diagram of an apparatus for manufacturing a compound single crystal according to a first embodiment of the invention.

FIG. 1 shows a schematic sectional diagram of an apparatus for manufacturing a compound single crystal according to a first embodiment of the invention. In FIG. 1, an apparatus 10 for manufacturing a compound single crystal has the following configuration.

(1) The apparatus 10 includes:
a crystal growth section 20 having a susceptor 24 to hold a seed crystal 22;
a gas supply section 40 to supply a metal-contained gas (a gas containing a metal vapor) generated from a metal source 50 and a reactant gas, which reacts with the metal-contained gas to form an inorganic compound, toward the seed crystal 22; and
a heating section 60 having a heating unit 62 to heat the seed crystal 22 and the metal source 50.

(2) The gas supply section 40 includes:
a crucible 42 disposed separately from the susceptor 24 and holding the metal source 50;
a carrier gas supply unit that supplies a carrier gas into the crucible 42, and supplies a mixed gas of the metal-contained gas and the carrier gas toward the seed crystal 22; and
a reactant gas supply unit to supply the reactant gas toward the seed crystal 22.

(3) A porous baffle plate 48 is provided in an opening of the crucible 42.

The apparatus 10 may further include:
(a) a first movable unit 28 to change a vertical or horizontal distance between the porous baffle plate 48 and the susceptor 24;
(b) a second movable unit 64 to change a vertical or horizontal distance between the heating unit 62 and the crucible 42; and/or
(c) an angle changing unit 30 that changes a tilt angle of a surface of the seed crystal 22.

[1.1. Crystal Growth Section]
[1.1.1. Susceptor]

The crystal growth section 20 has the susceptor 24 to hold the seed crystal 22. The susceptor 24 is placed in a reaction container 26. The inner atmosphere and pressure of the reaction container 26 can be controlled using an exhaust device (not shown).

A structure of the susceptor 24 is not particularly limited, and an optimum structure can be selected according to the purpose. Material of the reaction container 26 is not particularly limited, and an optimum material can be selected according to the purpose. Examples of the reaction container 26 include a quartz chamber.

The susceptor 24 is placed at a position such that the mixed gas to be discharged through the porous baffle plate 48 can be supplied to the surface of the seed crystal 22. A positional relationship between the susceptor 24 and the crucible 42 is not particularly limited, and an optimum positional relationship can be selected according to the structure of the crucible 42.

In the example of FIG. 1, the susceptor 24 is disposed above the crucible 42. The mixed gas discharged through the porous baffle plate 48 rises toward the susceptor 24.

When the apparatus further includes a unit (not shown) that changes a flow direction of the mixed gas discharged from the crucible 42 to a horizontal direction, the susceptor 24 and the crucible 42 can be horizontally disposed.

That is, the invention can be applied to each of:
(a) a vertical furnace, in which the reaction container 26 is placed such that a longitudinal direction of the reaction container 26 is a vertical direction, and the crucible 42 and the susceptor 24 are vertically disposed, and
(b) a horizontal furnace, in which the reaction container 26 is placed such that the longitudinal direction of the reaction container 26 is a horizontal direction, and the crucible 42 and the susceptor 24 are horizontally disposed.

[1.1.2. First Movable Unit]

The susceptor 24 (or seed crystal 22) is disposed by a certain distance away from the porous baffle plate 48 (or the opening of the crucible 42). A distance between the porous baffle plate 48 and the susceptor 24 (hereinafter also referred to as "baffle-to-susceptor distance") may be fixed or variable.

When the baffle-to-susceptor distance is fixed, a distance between the porous baffle plate 48 and a surface of a growing crystal (hereinafter also referred to as "baffle-to-growing crystal distance") decreases along with growth of the single crystal. The baffle-to-growing crystal distance is in general preferably maintained within a predetermined range to stably continue growth of the single crystal. Hence, when a thick single crystal is grown, the first movable unit 28 is preferably provided to change the vertical or horizontal distance between the baffle and the susceptor.

The first movable unit 28 may be provided in one or both of the crystal growth section 20 and the gas supply section 40. That is, the first movable unit 28 may be any one of:
(a) a unit that can move the susceptor 24 while the crucible 42 is fixed;
(b) a unit that can move the crucible 42 while the susceptor 24 is fixed; and
(c) a unit that can move both the susceptor 24 and the crucible 42.

Temperature of each section is preferably actively controlled to stably continue growth of the single crystal. To achieve this, the first movable unit 28 is preferably capable of moving the susceptor 24. In the case of a vertical furnace in which the susceptor 24 is disposed above the crucible 42 as shown in FIG. 1, the first movable unit 28 is preferably capable of moving the susceptor 24 in a vertical direction.

[1.1.3. Angle Changing Unit]

The tilt angle of the surface of the seed crystal may be fixed or variable. The term "tilt angle of the surface of the seed crystal (hereinafter also simply referred to as "tilt angle")" means an angle formed by the normal direction of the surface of the seed crystal 22 and a supply direction of the mixed gas.

The mixed gas is typically supplied from the normal direction of the surface of the seed crystal 22. However, when the mixed gas is supplied from an oblique direction with respect to the surface of the seed crystal 22, the growth rate may increase. In such a case, the angle changing unit 30 to change the tilt angle is preferably provided in the crystal growth section 20.

A structure of the angle changing unit 30 is not particularly limited, and an optimum structure can be selected according to the purpose. A changing range of the tilt angle is not particularly limited, and an optimum changing rate can be selected according to the purpose. The tilt angle is typically 0 to 60°.

[1.2. Gas Supply Section]

The gas supply section 40 supplies a metal-contained gas and a reactant gas, which reacts with the metal-contained gas to form an inorganic compound, toward the seed crystal 22. The metal-contained gas is generated by heating the metal source 50 to a predetermined temperature.

The term "metal-contained gas" means a gas containing a metal vapor produced by vaporizing a molten metal. The metal source 50 may include a metal alone or a mixture of a metal and a metal compound. When the metal source 50 contains an appropriate amount of metal compound, the growing crystal may be doped with an element contained in the metal compound.

As described above, the gas supply section 40 includes the crucible 42 disposed separately from the susceptor 24 and holding the metal source 50, the carrier gas supply unit that supplies the carrier gas into the crucible 42, and supplies the mixed gas of the metal-contained gas and the carrier gas toward the seed crystal 22, and the reactant gas supply unit to supply the reactant gas toward the seed crystal 22.

The porous baffle plate 48 is provided in the opening of the crucible 42.

[1.2.1. Porous Baffle Plate]

In the invention, the porous baffle plate 48 is provided in the opening of the crucible 42. The invention is different in this point from the related art. The term "porous baffle plate" means a plate-like component having a plurality of through-holes each having a small diameter. The porous baffle plate 48 must have:

(a) a function of discharging the mixed gas from the inside to the outside of the crucible 42; and
(b) a function of suppressing backflow of the reactant gas from the outside to the inside of the crucible.

Hence, diameters and the number of the through-holes are preferably selected such that both the functions are compatible.

In general, a smaller opening area of the porous baffle plate 48 (area per through-hole×the number of through-holes) increases a flow rate (hereinafter also referred to as "crucible outlet gas-flow-rate") of the mixed gas passing through the porous baffle plate 48, and thus improves a function of preventing backflow of the reactant gas. However, an excessively small opening area increases resistance to passage of the mixed gas through the porous baffle plate 48, and thus deteriorates a function of discharging the mixed gas.

An excessively high crucible outlet gas-flow-rate decreases the temperature of the porous baffle plate 48. This results in a decrease in the temperature of the metal-contained gas passing through the porous baffle plate 48, and thus metal droplets may be formed on the growing crystal. In addition, the backflow reactant gas may directly enter the crucible 42 while being not decomposed during passage through the porous baffle plate 48, and may react with the metal source in the crucible 42. The porous baffle plate 48 therefore preferably satisfies the following condition.

[A. Volume Ratio $((1-V_H/V_B)\times 100)$]

The porous baffle plate 48 preferably satisfies Expression (1).

$$80\% \leq (1-V_H/V_B)\times 100 < 100\% \tag{1}$$

where $V_B$ is an apparent volume of the porous baffle plate 48, $V_H$ is a total volume of through-holes contained in the porous baffle plate 48, and "apparent volume" means the volume of the porous baffle plate 48 including porous portions.

In the case of a small volume ratio $((1-V_H/V_B)\times 100)$ (i.e., a large number of through-holes per area), the crucible outlet gas-flow-rate must be increased to prevent entering of the reactant gas into the crucible 42. However, as the crucible outlet gas-flow-rate is higher, the temperature of the porous baffle plate 48 more decreases. The volume ratio is preferably 80% or more to prevent entering of the reactant gas without excessively decreasing the temperature of the porous baffle plate 48. The volume ratio is more preferably 85% or more.

On the other hand, an excessively large volume ratio makes it difficult to discharge the metal-contained gas from the crucible. The volume ratio is therefore necessary to be less than 100%. The volume ratio is preferably 95% or less.

Using the porous baffle plate 48 satisfying Expression (1) allows the crucible outlet gas-flow-rate to be less than 20 m/sec. This is because the reactant gas (for example, NH$_3$) is decomposed during passage through the through-holes of the porous baffle plate 48 due to suppression of a decrease in the temperature of the porous baffle plate 48, and thus the reactant gas is prevented from being supplied into the metal source 50.

[B. $a^2$/L Ratio]

The porous baffle plate 48 further preferably satisfies not only Expression (1) but also Expression (2).

$$0.0003 < a^2/L < 1.1 \tag{2}$$

where

"a" is a diameter of the through-hole of the porous baffle plate 48, and

L is a length of the through-hole of the porous baffle plate 48.

As described later, the crucible outlet gas-flow-rate is proportional to the reciprocal of the opening area ($S_p$) of the porous baffle plate 48. The gas conductance C of the porous baffle plate 48 is represented by Expression (3).

$$C = \pi \times (a/2)^4 \times p \times n/(8\eta \times L) \tag{3}$$

where

P is process pressure (Pa), and

η is the coefficient of viscosity of gas (μP).

Figure 10:
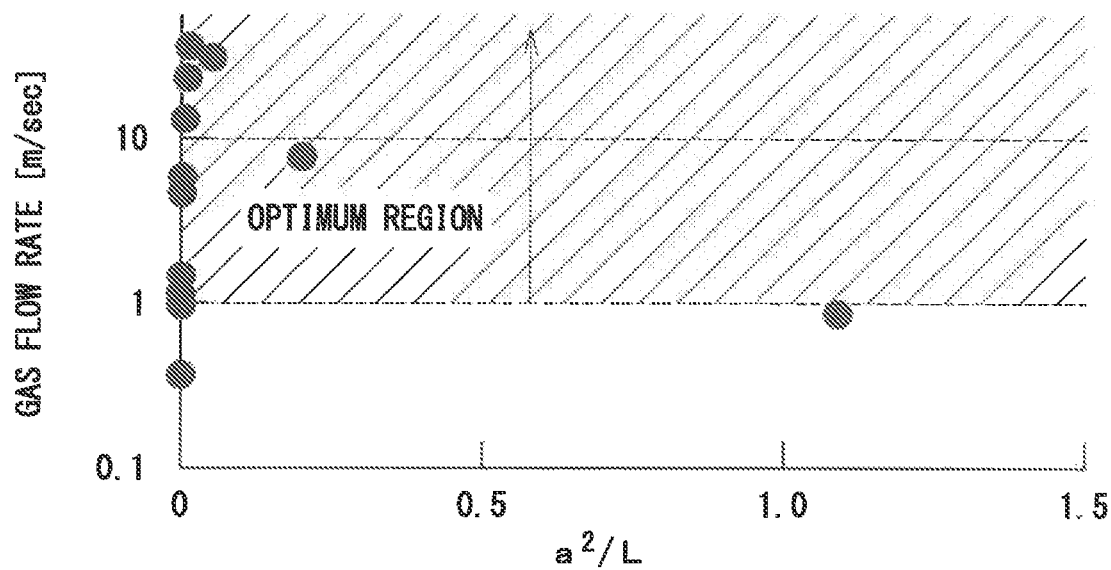
FIG. 10 is a graph showing dependence of $a^2/L$ ratio on a crucible outlet gas-flow-rate.

The expression of the crucible outlet gas-flow-rate and the expression of the gas conductance reveal that the crucible outlet gas-flow-rate is not higher with a smaller opening area ($S_p$). For example, when the opening area of the porous baffle plate 48 is smaller than a certain value, the crucible outlet gas-flow-rate decreases due to a decrease in gas conductance (see FIG. 10). FIG. 10 shows that the range of $a^2/L$ satisfying the crucible outlet gas-flow-rate of 1 m/sec or more is represented by Expression (2).

[C. $S_B/S_L$ Ratio (Melt Area Ratio)]

As described above, the volume ratio and the $a^2/L$ ratio each have an optimum value. In addition, at least a certain area is required as the area ($S_B$) of the porous baffle plate 48. If the metal source 50 includes a molten metal, the surface area (melt area) of the metal source 50 is designated by $S_L$.

If the area $S_B$ of the porous baffle plate 48 is excessively smaller than the melt area $S_L$ of the metal source 50, the growth rate decreases. A ratio ($S_B/S_L$) of the area ($S_B$) of the porous baffle plate 48 to the surface area ($S_L$) of the metal source 50 is therefore preferably 0.1 or more. The $S_B/S_L$ ratio is preferably 0.3 or more, and more preferably 0.5 or more.

As described later, when a double crucible is used, $S_B$ can be made larger than $S_L$. However, an unnecessary increase in $S_B$ is impractical. The $S_B/S_L$ ratio is therefore preferably 2.5 or less. The $S_B/S_L$ ratio is preferably 2.0 or less, and more preferably 1.5 or less.

[D. Through-Hole Shape]

Each of the through-holes formed in the porous baffle plate 48 may be a through-hole having a uniform diameter (for example, a cylindrical or prismatic through-hole), or may be a through-hole having a portion having a different diameter along a thickness direction of the porous baffle plate 48. Partially reducing the through-hole diameter reduces the opening area, and thus increases the crucible outlet gas-flow-rate. Hence, the gas flow rate can be locally increased by changing a through-hole structure of the porous baffle plate 48. This facilitates the gas mixing.

Figure 12A:
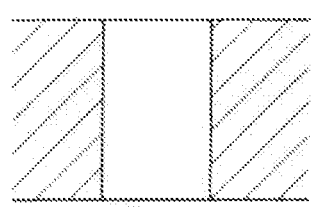
FIGS. 12A to 12L each show an exemplary through-hole structure of the porous baffle plate.
Figure 12B:
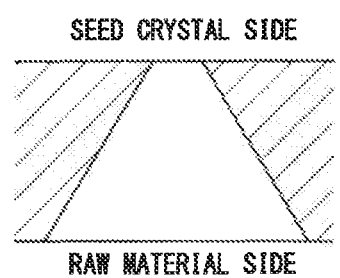
Figure 12C:
Figure 12D:
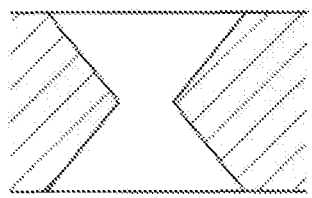
Figure 12E:
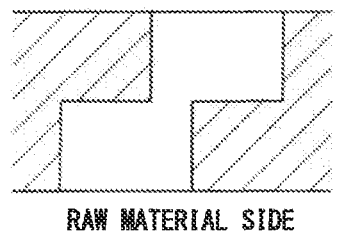

FIGS. 12A to 12I each show an exemplary through-hole structure of the porous baffle plate 48. FIG. 12A shows an example of a through-hole having a diameter that is uniform along a thickness direction. FIG. 12B shows an example of a through-hole having a diameter linearly reduced in an inverse tapered shape from the metal source 50 to the seed crystal 22. FIG. 12C shows an example of a through-hole having a diameter nonlinearly reduced in a bell shape from the metal source 50 to the seed crystal 22. FIGS. 12D and 12E each show an example of a through-hole having a diameter narrowed at an intermediate point.

Figure 12F:
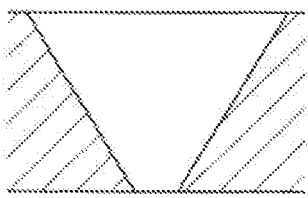
Figure 12G:
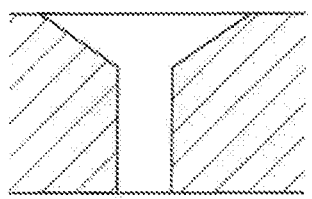
Figure 12H:
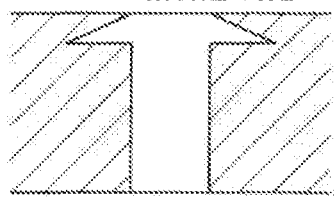
Figure 12I:

FIG. 12F shows an example of a through-hole having a diameter linearly increased in a tapered shape from the metal source 50 to the seed crystal 22. In such a structure, since a gas passing through the porous baffle plate 48 expands in an in-plane direction, gas mixing is also easily performed. Such an effect can also be achieved by the structures of FIGS. 12G and 12H. Furthermore, a structure as shown in FIG. 12I, even if having a uniform diameter, may also promote diffusion of the gas in an in-plane direction as with FIGS. 12F to 12H. As a result, formation of polycrystals or particles on the porous baffle plate 48 is suppressed, leading to improvement in quality of grown crystal.

Figure 12J:
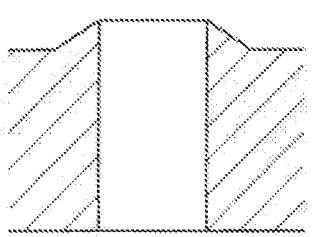
Figure 12K:
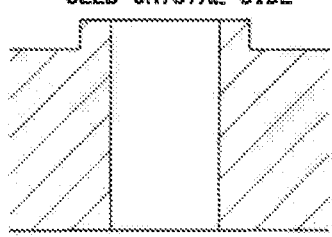
Figure 12L:
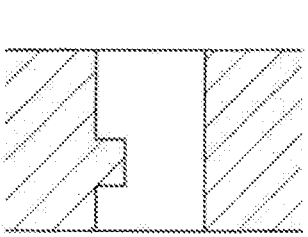

In the examples shown in FIGS. 12J and 12K, conical and cylindrical protrusions are formed, respectively, on the upper surfaces of the porous baffle plates 48. FIG. 12L shows an example of a through-hole in which a protrusion is formed so as to narrow the diameter at an intermediate point of the through-hole.

[1.2.2. Crucible]

[A. Crucible Structure]

A structure of the crucible 42 is not particularly limited as long as the structure exhibits the above-described functions. In the example of FIG. 1, the crucible 42 includes:

(a) an inner crucible 42a to hold the metal source 50, and an outer crucible 42b to accommodate the inner crucible 42a;

(b) a carrier gas channel 42c, which is provided between an outer wall surface of the inner crucible 42a and an inner wall surface of the outer crucible 42b so as to flow the carrier gas toward the inside of the inner crucible 42a; and (c) a carrier gas inlet 42d, which is provided in the bottom surface or the side surface of the outer crucible 42b so as to introduces the carrier gas into the carrier gas channel 42c.

Although the carrier gas inlet 42d is provided in the bottom surface of the outer crucible 42b in the example of FIG. 1, it may be provided in the side surface of the outer crucible 42b.

The carrier gas channel 42c may be any channel that can flow the carrier gas toward the inside of the inner crucible 42a. However, if flow of the carrier gas in the inside of the inner crucible 42a is greatly away from the surface of the metal source 50, the discharge amount of the metal-contained gas decreases. Hence, the carrier gas channel 42c is preferably capable of flowing the carrier gas toward the surface of the metal source 50, or capable of flowing the carrier gas along near the surface of the metal source 50.

To increase the discharge amount of the metal-contained gas without complicating the structure of the crucible 42, the carrier gas channel 42c is preferably capable of flowing the carrier gas toward the top of the inner crucible 42a, and a carrier-gas flow direction adjuster 42e is preferably provided in the upper part of the outer crucible 42b so as to change a direction of the carrier gas flow to a direction toward the metal source 50 after the carrier gas flow has reached the top of the inner crucible 42a.

Optimizing a shape of the carrier gas channel 42c, which is formed in a gap between the inner crucible 42a and the outer crucible 42b, makes it possible to flow the carrier gas toward the top of the inner crucible 42a. The carrier-gas-flow direction adjuster 42e may be any adjuster that can change the upward carrier gas flow to a downward or obliquely downward flow after the carrier gas flow has reached the top of the inner crucible 42a.

For example, as shown in FIG. 1, a cylindrical component (carrier-gas flow direction adjuster 42e) having an outer diameter smaller than the inner diameter of the inner crucible 42a is provided on the top of the outer crucible 42b. This makes it possible to change the vertically upward carrier gas flow to a vertically downward flow. When the flow direction of the carrier gas is changed to the vertically downward direction, the carrier gas is blown to the surface of the metal source 50 and changed into a mixed gas containing the metal-contained gas. The flow of the carrier gas (mixed gas) colliding with the surface of the metal source 50 is changed again to a vertically upward flow, and the mixed gas is discharged to the outside through the porous baffle plate 48.

[B. Crucible Material]

The material of the crucible 42 is not particularly limited, and an optimum material can be selected according to types of the metal source 50.

Examples of the material of the crucible 42 include graphite, SiC-coated graphite, pBN-coated graphite, and TaC-coated graphite.

[C. Relative Density and Average Pore Size]

If the metal source 50 is a liquid metal having good wettability on the surface of the inner crucible 42a, the liquid metal may creep up the wall surface of the inner crucible 42a during crystal growth. If such creep-up occurs during crystal growth, raw material supply to the surface of the seed crystal 22 becomes unstable. In some condition, the liquid metal gets over the sidewall of the inner crucible 42a and leaks to the outside of the inner crucible 42a. The creep-up may therefore cause an increase in impurity concentration in the grown crystal. In the case of using the liquid metal as the metal source 50, the creep-up is preferably suppressed to produce a grown crystal having a small amount of impurities.

A method of suppressing the creep-up includes (a) increasing the relative density of the inner crucible 42a, and (b) increasing the average pore size of the inner crucible 42a.

In the former method, the creep-up due to capillary action is simply suppressed by eliminating micropores. The inner crucible 42a preferably has a relative density of 99% or more to suppress the creep-up.

In the latter method, if the inner crucible 42a is porous (i.e., difficult to be densified due to various restrictions), creep-up height is reduced by increasing the average pore size.

The creep-up height h is represented by Expression (4).

$$h = 2\gamma_L \cos\theta / \rho g r \qquad (4)$$

where $\theta$ is contact angle, $\gamma_L$ is surface tension of molten metal, r is inner diameter of a tube (micropore), $\rho$ is density of molten metal, and g is gravitational acceleration.

Of these, the surface tension $\gamma_L$ and the density p are determined by the molten metal. On the other hand, the contact angle $\theta$ is determined by interfacial tension between the molten metal and the inner crucible 42a, and the inner diameter r of the tube is determined by a micropore structure of each of the surface and the inside of the inner crucible 42a. Hence, the creep-up height h is determined according to Expression (4), and if the height is higher than the depth of the inner crucible 42a, the liquid metal leaks to the outside of the inner crucible 42a. A material that is less likely to cause such a phenomenon is preferably used for the inner crucible 42a. The average pore size is preferably one hundred micrometers or more to secure the creep-up height of several centimeters or less (see FIG. 7).

The condition of the relative density of 99% or more or the average pore size of 100 μm or more may be satisfied at least by the inner crucible 42a, but may be further satisfied by the outer crucible 42b.

[1.2.3. Carrier Gas Supply Unit]

The carrier gas supply unit supplies the carrier gas into the crucible 42, and supplies the mixed gas of the metal-contained gas and the carrier gas toward the seed crystal 22. The structure of the carrier gas supply unit is not particularly limited, and an optimum structure can be selected according to the purpose. In the example of FIG. 1, the carrier gas supply unit has a piping 44 to flow the carrier gas, and one end of the piping 44 is coupled to the carrier gas inlet 42d of the outer crucible 42b and the other end thereof is coupled to a carrier gas source (not shown).

[1.2.4. Reactant Gas Supply Unit]

The reactant gas supply unit supplies the reactant gas toward the seed crystal 22. The reactant gas supply unit may supply only the reactant gas or may supply the mixture of the reactant gas and the diluent gas (carrier gas).

The metal-contained gas and the reactant gas must be uniformly mixed near the surface of the seed crystal 22 to grow a single crystal including an inorganic compound on the surface of the seed crystal 22. The structure of the reactant gas supply unit is not particularly limited as long as the unit exhibits such a function. In the example of FIG. 1, the reactant gas supply unit has a piping 46 to supply the reactant gas, and one end of the piping 46 is inserted in the reaction container 26 and the other end thereof is coupled to a reactant gas source (not shown) and to a diluent gas source (not shown).

The reactant gas supply unit is preferably capable of supplying the reactant gas toward the mixed gas to be discharged through the porous baffle plate 48. To achieve this, a reactant-gas-flow direction adjuster 52 is preferably provided between the susceptor 24 and the crucible 42 to change the direction of the reactant gas flow to a direction toward the mixed gas to promote mixing of the mixed gas and the reactant gas.

For example, as shown in FIG. 1, when the susceptor 24 is separately disposed vertically above the crucible 42, a hollow disc (reactant-gas-flow direction adjuster 52) is placed between the susceptor 24 and the crucible 42. In such a case, the mixed gas of the metal-contained gas and the carrier gas directly rises toward the seed crystal 22 through the through-holes of the porous baffle plate 48.

On the other hand, the reactant gas introduced into the reaction container 26 rises in the reaction container 26, and collides with the bottom surface of the hollow disc after passing along a lateral side of the crucible 42. When the reactant gas collides with the bottom surface of the hollow disc, the flow direction of the reactant gas is changed to a horizontal direction (direction along the opening of the crucible 42), and the reactant gas joins with the mixed gas above the porous baffle plate 48. The flow direction of such a joined gas (the mixture of the mixed gas and the reactant gas) is changed again at the opening of the hollow disc to a vertically upward direction, so that the joined gas is supplied to the surface of the seed crystal 22.

Although the reactant gas can be supplied to the surface of the seed crystal 22 even if the reactant-gas-flow direction adjuster 52 is not provided, the reactant-gas-flow direction adjuster 52 makes it possible to produce a joined gas having a uniform composition. In addition, the joined gas having a uniform composition is supplied to the surface of the seed crystal 22, resulting in stable growth of the single crystal.

[1.3. Heating Section]

[1.3.1. Heating Unit]

The heating section 60 includes the heating unit 62 to heat the seed crystal 22 (or susceptor 24) and the metal source 50 (or crucible 42). The structure of the heating unit 62 is not particularly limited, and an optimum structure can be selected according to the purpose.

Examples of the heating unit 62 include:

(a) a resistance heating unit to heat the seed crystal 22 and the metal source 50 using a heater; and (b) a high frequency induction heating unit to heat the seed crystal 22 and the metal source 50 using an RF coil.

Of these, the resistance heating unit heats not only the seed crystal 22 and the metal source 50 but also the reaction container 26 to isolate the seed crystal 22 and the metal source 50 from the open air. The resistance heating unit is therefore effective only when the growth temperature of the single crystal is lower than the heatproof temperature of the reaction container 26.

On the other hand, the high frequency induction heating unit can directly heat the seed crystal 22 and the metal source 50 without directly heating the reaction container 26 by optimizing the material of the reaction container 26. The high frequency induction heating unit is therefore particularly effective when the growth temperature of the single crystal is higher than the heatproof temperature of the reaction container 26.

The heating section 60 may include one or more heating units 62. Using a plurality of heating units 62 makes it easy to independently control the temperature of each section, but may complicate an apparatus structure, or may complicate active control of the temperature of each section.

On the other hand, using one heating unit 62 provides a relatively simple apparatus structure, but makes it difficult to actively control the temperature of each section. In such a case, the second movable unit 64 as described below is preferably used to control a position between the heating unit 62 and the crucible 42.

[1.3.2. Second Movable Unit]

The heating unit 62 is disposed outside the reaction container 26 and around the seed crystal 22 and the crucible 42. A distance between the heating unit 62 and the crucible 42 (hereinafter, referred to as "heating unit-to-crucible distance) may be fixed or variable.

The term "heating unit-to-crucible distance" means:
(a) in the case of a vertical furnace as shown in FIG. 1, a distance (vertical distance) between a vertical reference point of the heating unit 62 (for example, a lower end of the RF coil having a central axis disposed vertically) and a vertical reference point of the crucible 42 (for example, the surface of the metal source 50 in the crucible 42); or
(b) in the case of an undepicted horizontal furnace, a distance (horizontal distance) between a horizontal reference point of the heating unit 62 (for example, one end of the RF coil having a central axis disposed horizontally) and a horizontal reference point of the crucible 42 (for example, the central axis of the crucible 42).

When the heating unit-to-crucible distance is fixed, the temperature of each section may be gradually deviated from the optimum with growth of the single crystal, and thus successive growth may be difficult. Hence, when a thick single crystal is grown, the second movable unit 64 is preferably provided to change the vertical or horizontal distance between the heating unit and the crucible.

The second movable unit 64 may be provided in one or both of the heating section 60 and the gas supply section 40. That is, the second movable unit 64 may be any one of:
(a) a unit capable of moving the heating unit 62 while the crucible 42 is fixed;
(b) a unit capable of moving the crucible 42 while the heating unit 62 is fixed; and
(c) a unit capable of moving both the heating unit 62 and the crucible 42.

The temperature of each section is preferably actively controlled to stably continue growth of the single crystal. To achieve this, the second movable unit 64 is preferably capable of moving the heating unit 62. For example, when the reaction container 26 is disposed such that its longitudinal direction corresponds to the vertical direction as shown in FIG. 1, the second movable unit 64 is preferably capable of vertically moving the heating unit 62.

[1.4. Control Section]

The apparatus 10 has a control section (not shown) to control the temperature of the susceptor 24 (or growing crystal), the temperature of the crucible 42, carrier-gas flow rate, and reactant-gas flow rate. When the apparatus 10 has the first movable unit 28, the second movable unit 64, and/or the angle changing unit 30, the control section further controls the operation of these units.

[1.4.1. Control of Temperature and Pressure]

The crucible 42 having the metal source 50 therein and the susceptor 24 holding the seed crystal 22 are heated by the heating unit 62. Temperature of the metal source 50 (or the temperature of the inner crucible 42a): $T_S$, a growth temperature (the temperature of the growing crystal, the seed crystal 22, or the susceptor 24): $T_G$, and the temperature of the porous baffle plate 48: $T_B$ are monitored using a radiation thermometer or a thermocouple. Such temperatures can be controlled by performing feedback on the power applied to the heating unit 62, a position of the heating unit 62, and a position of the susceptor 24.

Growth pressure (inner pressure of the reaction container 26) is monitored by a pressure gauge (for example, Baratron pressure transducer). The growth pressure can be controlled by exhaust velocity (determined by rotational frequency of a vacuum pump and the degree of opening of a conductance valve) and a gas flow rate.

[1.4.2. Control of First Movable Unit]

Figure 2:
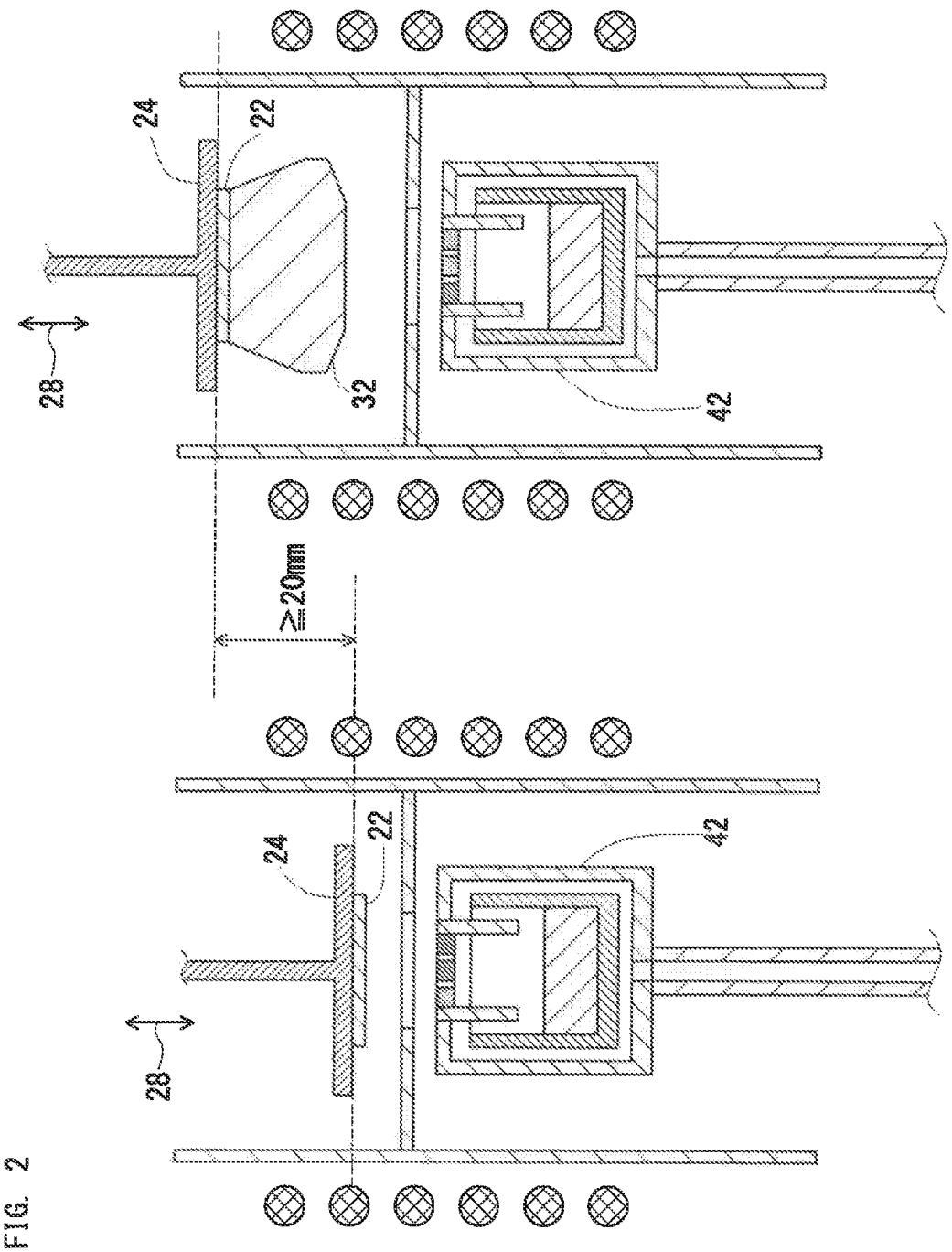
FIG. 2 is a schematic sectional diagram to explain a positional relationship between a susceptor and a crucible.

FIG. 2 shows a schematic sectional diagram to explain a positional relationship between the susceptor 24 and the crucible 42. FIG. 2 shows an example of a vertical furnace, i.e., an example where the susceptor 24 and the crucible 42 are vertically arranged. As described above, the apparatus 10 preferably has the first movable unit 28 for changing the baffle-to-susceptor distance in order to stably continue growth of a single crystal 32.

A movable range of the susceptor 24 (or seed crystal 22) affects a producible thickness of the single crystal 32. The movable range of the susceptor 24 is preferably 20 mm or more to produce a thick single crystal 32. The movable range is preferably 100 mm or more.

The changing speed of the baffle-to-susceptor distance (driving speed of the first movable unit 28) is preferably freely adjusted within a range from 0.1 mm/h to 5 mm/sec.

[1.4.3. Control of Second Movable Unit]

Figure 3:
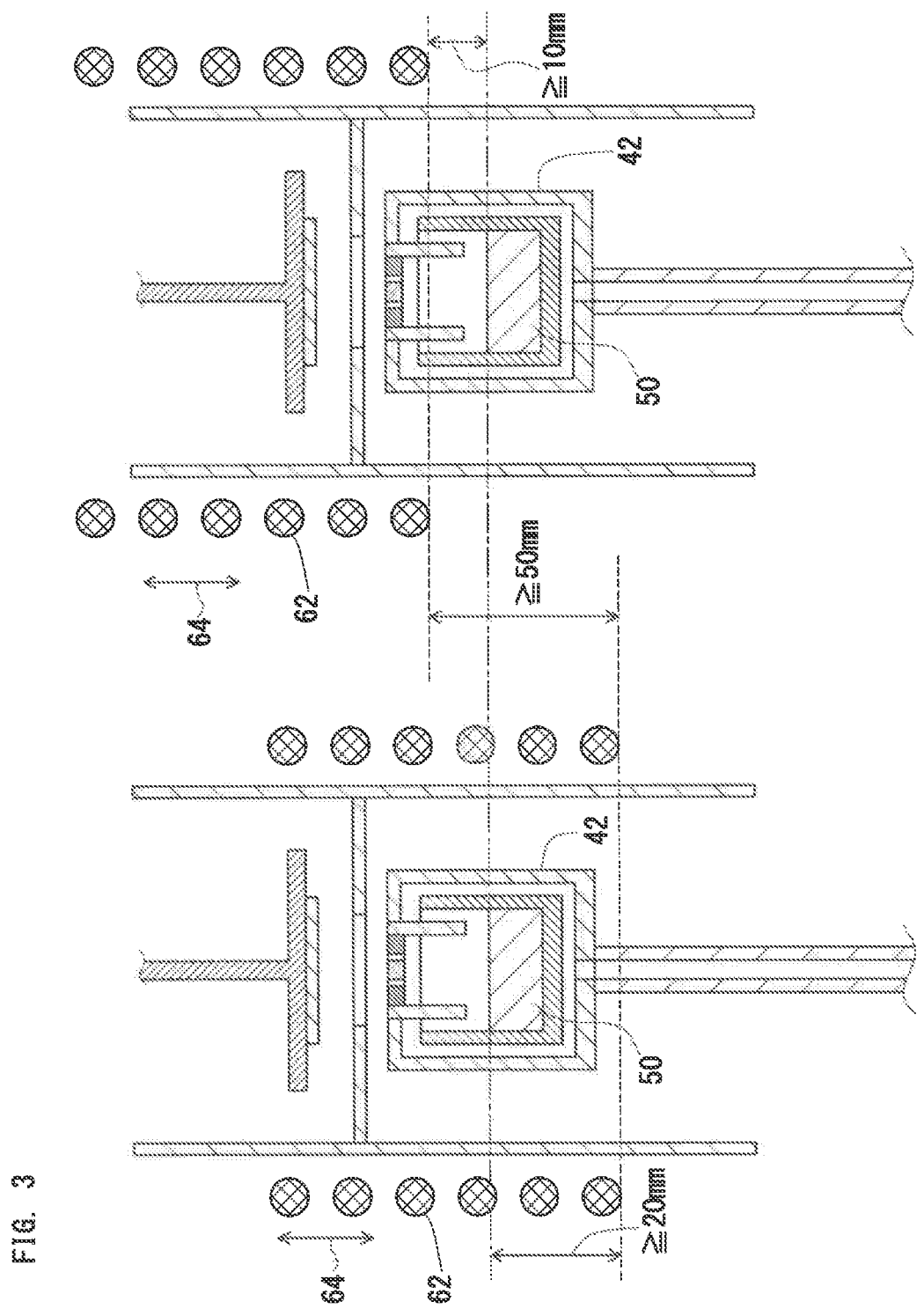
FIG. 3 is a schematic sectional diagram to explain a positional relationship between the crucible and an RF coil.

FIG. 3 shows a schematic sectional diagram to explain a positional relationship between the crucible 42 and the heating unit (RF coil) 62. FIG. 3 shows an example of a vertical furnace, in which the reaction container 26 is disposed such that a longitudinal direction of the reaction container 26 corresponds to the vertical direction. As described above, when a thick single crystal 32 is grown, the second movable unit 64 is preferably provided to change the heating unit-to-crucible distance.

The movable range of the heating unit 62 affects the quality or growth rate of the single crystal 32. To produce a thick and high-quality single crystal 32 in the vertical furnace, the movable range of the heating unit 62 preferably meets the following conditions:
(a) a lower end position of the heating unit 62 is downward movable at least 20 mm from an upper end position of the metal source 50;
(b) the lower end position of the heating unit 62 is upward movable at least 10 mm from the upper end position of the metal source 50; and
(c) the total movable range of the lower end of the heating unit 62 is 50 mm or more.

The total movable range of the heating unit 62 is preferably 200 mm or more.

The changing speed of the heating unit-to-crucible distance (driving speed of the second movable unit 64) is preferably freely adjusted within a range from 0.1 mm/h to 5 mm/sec.

[2. Apparatus for Manufacturing Compound Single Crystal (2)]

Figure 4:
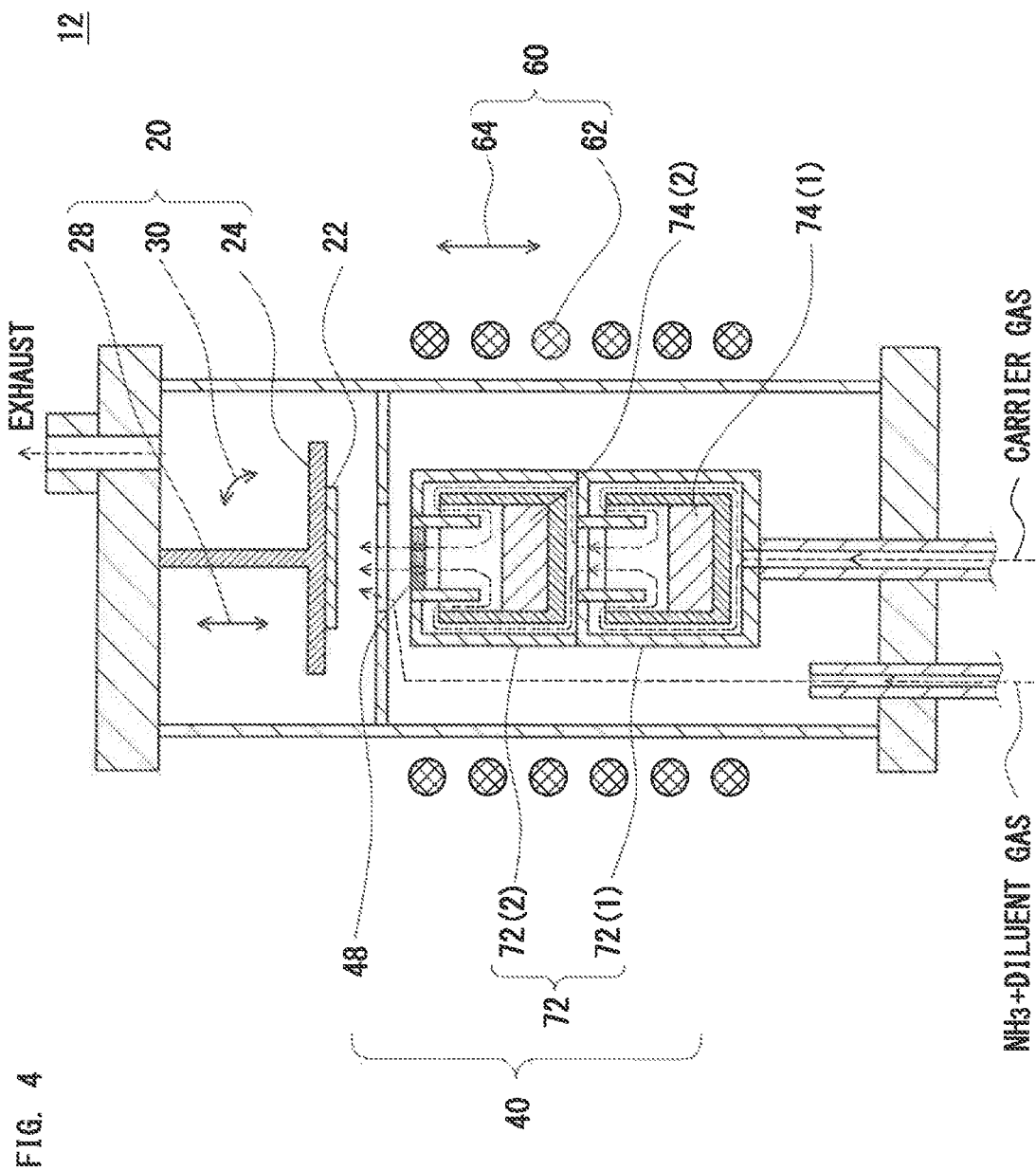
FIG. 4 is a schematic sectional diagram of an apparatus for manufacturing a compound single crystal according to a second embodiment of the invention.

FIG. 4 shows a schematic sectional diagram of an apparatus for manufacturing a compound single-crystal according to a second embodiment of the invention. In FIG. 4, an apparatus 12 for manufacturing a compound single crystal has the following configuration.

(1) The apparatus 12 includes:
a crystal growth section 20 having a susceptor 24 to hold a seed crystal 22;

a gas supply section 40 to supply a metal-contained gas, which is generated from a first metal source 74(1), a second metal source 74(2), ..., and an n-th metal source 74(n), and a reactant gas, which reacts with the metal-contained gas to form an inorganic compound, toward the seed crystal 22; and a heating section 60 having a heating unit 62 to heat the seed crystal 22 and the first metal source 74(1), the second metal source 74(2), ..., and the n-th metal source 74(n).

(2) The gas supply section 40 includes:

a crucible 72 disposed separately from the susceptor 24 and holding the first metal source 74(1), the second metal source 74(2), ..., and the n-th metal source 74(n);

a carrier gas supply unit that supplies a carrier gas into the crucible 72, and supplies a mixed gas of the metal-contained gas and the carrier gas toward the seed crystal 22; and a reactant gas supply unit to supply the reactant gas toward the seed crystal 22.

(3) A porous baffle plate 48 is provided in an opening of the crucible 72.

The apparatus 12 may further include:

(a) a first movable unit 28 to change a vertical or horizontal distance between the porous baffle plate 48 and the susceptor 24;

(b) a second movable unit 64 to change a vertical or horizontal distance between the heating unit 62 and the crucible 72; and/or (c) an angle changing unit 30 that changes a tilt angle of the surface of the seed crystal 22.

[2.1. Stacked Crucible and Porous Baffle Plate]

In the second embodiment, the crucible 72 is a stacked crucible including a first crucible 72(1), a second crucible 72(2), ..., and an n-th crucible 72(n) (n≥2) stacked upward in this order, in which the opening of a k-th crucible 72(k) (1≤k≤n−1) is coupled to the carrier gas inlet of a (k+1)-th crucible 72(k+1).

The porous baffle plate 48 may be provided at least in the opening of the uppermost n-th crucible 72(n). The second embodiment is different in these points from the first embodiment. FIG. 4 shows only the first crucible 72(1) and the second crucible 72(2) merely by way of example.

When the opening of the k-th crucible 72(k) is coupled to the carrier gas inlet of the (k+1)-th crucible 72(k+1), the carrier gas can be flowed from the lowermost first crucible 72(1) to the uppermost n-th crucible 72(n) without stopping. When the carrier gas inlet is provided in the bottom surface of each k-th crucible 72(k), such coupling is facilitated.

In the stacked crucible, the porous baffle plate 48 may be provided in the opening of the individual k-th crucible 72(k), or may be provided only in the opening of the uppermost n-th crucible 72(n). Even if the porous baffle plate 48 is provided only in the opening of the uppermost n-th crucible 72(n), backflow of the reactant gas can be prevented.

Other points of the crucible (stacked crucible) 72 and the porous baffle plate 48 are the same as those in the first embodiment, and description of them is omitted.

[2.2. Metal Source]

The first crucible 72(1), the second crucible 72(2), ..., and the n-th crucible 72(n) are filled with the first metal source 74(1), the second metal source 74(2), ..., and the n-th metal source 74(n), respectively. In the stacked crucible, the respective k-th metal sources 74(k) may include the same material or different materials.

When metal vapor is generated from the molten metal, vaporization rate of the metal is mainly proportional to the area of the surface of the molten metal. Hence, when the respective k-th crucibles 72(k) are filled with the same molten metal, the vaporization rate of the metal can be increased compared with the case of using one crucible.

On the other hand, when the respective k-th crucibles 72(k) are filled with different metal sources, a metal-contained gas containing two or more metal elements can be generated, i.e., a single crystal composed of a multicomponent inorganic compound containing the two or more kinds of metal elements can be grown on the surface of the seed crystal 22.

Other points of the metal source are the same as those in the first embodiment, and description of them is omitted.

[2.3. First Movable Unit]

The apparatus 12 shown in FIG. 4 may further include a first movable unit 28 to change the baffle-to-susceptor distance.

In such a case, "porous baffle plate" as the reference of the baffle-to-susceptor distance means the porous baffle plate 48 provided in the opening of the uppermost n-th crucible 72(n).

Other points of the first movable unit 28 are the same as those in the first embodiment, and description of them is omitted.

[2.4. Second Movable Unit]

The apparatus 12 shown in FIG. 4 may further include the second movable unit 64 to change the heating unit-to-crucible distance.

In the case of the vertical furnace, the movable range of the second movable unit 64 preferably meets the following conditions:

(a) a lower end position of the heating unit 62 is downward movable at least 20 mm from the upper end position of the first metal source 74(1) packed in the lowermost first crucible 72(1);

(b) the lower end position of the heating unit 62 is upward movable at least 10 mm from the upper end position of the n-th metal source 74(n) packed in the uppermost n-th crucible 72(n); and (c) the total movable range of the lower end of the heating unit 62 is at least 50 mm larger than the height of the crucible 72.

Other points of the second movable unit 64 are the same as those in the first embodiment, and description of them is omitted.

[2.5. Other Configurations]

Other configurations of the apparatus 12 are the same as those in the first embodiment, and description of them is omitted.

[3. Method for Manufacturing Compound Single Crystal (1)]

A method for manufacturing the compound single crystal according to the first embodiment of the invention is characterized in that the single crystal 32 including an inorganic compound is grown on the surface of the seed crystal 22 under a predetermined temperature condition using the apparatus 10 for manufacturing the compound single crystal according to the first embodiment of the invention.

[3.1. Metal Source]

In the invention, a species of the metal source 50 packed in the crucible 42 is not particularly limited, and an optimum species can be selected according to the purpose. In the invention, "metal" includes semimetal such as Si and Ge.

A metal in a liquid or solid state at a normal temperature can be used as the metal source 50. Examples of such a metal include B, Al, Ga, In, Zn, Cd, Hg, Si, Ge, Sn, Mg, Mn, Ti, V, Fe, Co, Ni, Cu, Y, Zr, Nb, Mo, and Ag.

In addition, the metal source 50 may include compounds (such as oxides, nitrides, and carbides) of such metals. When the metal source 50 contains an appropriate amount of metal compounds, heating the metal source 50 to a temperature of the decomposition temperature $T_D$ or higher makes it possible to generate a metal-contained gas containing a constituent element (for example, oxygen) other than metal elements.

The metal used as the metal source 50 may be pure metal, or a mixture or alloy containing at least two metals. Pure metal is preferably used for the metal source 50 to stabilize a composition of the metal-contained gas.

In particular, the metal source 50 preferably includes a metal containing at least one metal element selected from a group consisting of Al, Ga, In, Zn, Cd, Hg, Si, Ge, Sn, Mg, Mn, Cu, and Ag. Each of such metals can generate a metal vapor at a low temperature (<1500° C.), and is thus preferable for the metal source 50. The criterion of an easily vaporizable metal is a boiling point of about 2500° C. or lower.

[3.2. Reactant Gas]

The reactant gas supplies an element that constitutes the inorganic compound and is different from the element supplied from the metal source 50. In the invention, a type of the reactant gas is not particularly limited, and an optimum type can be selected according to the purpose.

The reactant gas preferably contains at least any one element selected from a group consisting of C, B, N, P, As, Sb, O, S, Se, and Te. The reactant gas specifically includes:
(a) a hydride gas (for example, $H_2O$, $NH_3$, a hydrocarbon gas, $BH_3$, $PH_3$, $AsH_3$, $H_2Sb$, $H_2S$, $H_2Se$, and $H_2Te$); and
(b) diatomic molecule gas (for example, $O_2$ and $N_2$).
A highly reactive hydride gas is preferably used as the reactant gas to grow a single crystal at a high rate or at a high yield using the metal source 50.

[3.3. Carrier Gas (or Diluent Gas)]

In the invention, a type of the carrier gas is not particularly limited, and an optimum type can be selected according to the purpose. Examples of the carrier gas include $N_2$, Ar, $H_2$, He, and Ne. Such a gas can be used as the carrier gas (or diluent gas) for each of the metal-contained gas and the reactant gas.

Furthermore, an organo-metallic compound gas or the like may be appropriately used as a doping gas in addition to the reactant gas and the carrier gas.

[3.4. Seed Crystal]

A material of the seed crystal 22 is not particularly limited, and an optimum material can be selected according to a composition of the single crystal 32. For example, when a GaN single crystal is grown, a sapphire substrate, a SiC substrate, or a GaN substrate is typically used as the seed crystal 22. The seed crystal 22 is preferably cleaned to remove impurities and the like before crystal growth. Examples of the cleaning method include CAROS cleaning, RCA cleaning, and organic cleaning.

[3.5. Expression (10): Temperature Control]

In the first embodiment, growth of the single crystal 32 is performed under a condition where each section satisfies Expression (10).

$$T_G < T_D < T_S < T_B \quad (10)$$

where
$T_G$ is a growth temperature,
$T_S$ is the temperature of the metal source,
$T_D$ is the decomposition temperature of the inorganic compound, and
$T_B$ is the temperature of the porous baffle plate provided in the opening of the crucible.

The term "growth temperature $T_G$" means a temperature at a front end of growth, i.e., means a temperature of the seed crystal 22 or the susceptor 24 in an early stage of growth, but means a temperature near a top of the grown crystal in intermediate and later stages of the growth.

Expression (10) represents a condition for smoothly generating the metal-contained gas from the crucible 42, and a condition for stably growing the single crystal 32 on the surface of the seed crystal 22.

An excessively high growth temperature $T_G$ may cause decomposition of the single crystal 32 grown on the surface of the seed crystal 22. $T_G < T_D$ is necessary to suppress decomposition of the growing crystal on the surface of the seed crystal 22.

An excessively low growth temperature $T_G$ may cause a roughened surface of the single crystal 32. $T_G \geq 0.85 T_D$ is preferable to suppress such surface roughening.

An excessively low temperature $T_S$ of the metal source 50 may cause formation of an inorganic compound in the crucible 42. Formation of the inorganic compound in the crucible 42 may induce a bumping phenomenon or formation of a passive film, leading to unstable supply of the metal-contained gas. $T_D < T_S$ is necessary to suppress such unintended formation of the inorganic compound in the crucible 42.

Furthermore, an excessively low temperature $T_B$ of the porous baffle plate 48 results in liquidation or solidification of the metal on the surface of the porous baffle plate 48, causing particle contamination into the grown crystal. $T_S < T_B$ is necessary to suppress liquidation or solidification of the metal on the surface of the porous baffle plate 48.

An excessively high temperature $T_S$ of the metal source 50 may cause an extremely slow growth rate of the single crystal 32. $T_S \leq 1.12 T_D$ is preferable to maintain a high growth rate.

[3.6. Crucible Outlet Gas-Flow-Rate]

In the invention, the porous baffle plate 48 is provided in the opening of the crucible 42 to isolate the metal source 50 from the reactant gas. The inside of the crucible 42 is purged by the carrier gas to suppress contamination of the reactant gas into the crucible 42. A higher flow rate (crucible outlet gas-flow-rate) of the mixed gas passing through the porous baffle plate 48 is more preferable to suppress contamination of the reactant gas into the crucible 42.

The crucible outlet gas-flow-rate refers to a value represented by Expression (5).

$$V_B = (T_B/300) \times Q \times (P_0/P) \times (1/S_P) \quad (5)$$

where
$T_B$ is the temperature (K) of the porous baffle plate,
Q is a carrier-gas flow rate ($m^3$/sec),
$P_0$ is atmospheric pressure (101.325 k·Pa),
P is process pressure (k·Pa), and
$S_P$ is an opening area of the porous baffle plate ($m^2$).

Excessively slow $V_B$ causes backflow of the reactant gas into the crucible 42 due to vapor-phase diffusion, leading to a direct reaction of the reactant gas with the surface of the metal source 50. As a result, a passive film may be formed on the surface of the metal source 50, or a bumping phenomenon may occur due to a drastic reaction, leading to unstable supply of the metal-contained gas. A larger $V_B$ is more preferable to suppress contamination of the reactant gas into the crucible 42.

Increasing $V_B$ (to less than several meters per second in typical CVD) reduces time before the metal-contained gas reaches the growth surface. It is therefore possible to suppress generation of compound powder through a reaction of the metal-contained gas with the reactant gas in a vapor phase, and suppress condensation of the metal-contained gas in a form of droplets in a vapor phase. This makes it possible to suppress contamination of particles (different orientation grains or droplets) into the grown crystal and thus improve crystal quality.

On the other hand, the temperature of the porous baffle plate 48 tends to decrease with an increase in $V_B$. Such a decrease in the temperature of the porous baffle plate 48 decrease the temperature of the metal-contained gas passing through the porous baffle plate 48. As a result, a liquid film of the metal may be formed on the surface of the grown crystal. If the reactant gas passes through the porous baffle plate 48 having a low temperature, the reactant gas is directly contaminated into the crucible 42 without being decomposed. As a result, the reactant gas may vigorously react with the metal source 50 in the crucible 42.

On the other hand, when the porous baffle plate 48 satisfying the above-described condition is used, it is possible even at relatively low $V_B$ to concurrently achieve a high growth rate, prevention of formation of the liquid film on the grown-crystal surface, and prevention of contamination of the reactant gas into the crucible 42. Specifically, even if $V_3$ is within a range of 1 m/sec or higher and lower than 20 m/sec, the above-described problem can be solved.

[3.7. Growth Pressure, and Baffle-to-Grown Crystal Distance]

Increasing a material yield is important in light of cost reduction. The inventors of this application have found that growth pressure P and the baffle-to-grown crystal distance D are important parameters having influence on the material yield.

The term "material yield" means a weight ratio of the metal source 50 trapped in the grown crystal to the vaporized metal source 50.

To achieve a high material yield, the single crystal is preferably grown such that the growth pressure P satisfies Expression (6), and the baffle-to-grown crystal distance D satisfies Expression (7). If P and D are above the relevant range, the material yield decreases significantly. If P and D are below the relevant range, growth parameters such as pressure are difficult to be controlled.

$$0.1 \text{ kPa} < P < 6 \text{ kPa} \quad (6)$$

$$0.5 \text{ cm} \leq D < 5 \text{ cm} \quad (7)$$

[3.8. Growth Rate]

Using the apparatus for manufacturing the compound single crystal according to the invention easily achieves a crystal growth rate of about 100 μm/h. The growth rate is desirably 200 μm/h or more in light of manufacturing cost.

On the other hand, an excessively fast growth rate induces poly-crystallization or increase in crystal defects, leading to deterioration in crystal quality. The growth rate is therefore preferably 2 mm/h or less.

[3.9. Grown Crystal Size]

Using the apparatus for manufacturing compound single crystal according to the invention provides a single crystal having a growth height of several centimeters and a crystal bore (diameter) of several inches (ten and several centimeters). The growth height is preferably 20 mm or more in light of manufacturing cost (including cutting cost and the like). The crystal bore is desirably 50 mm or more in light of device cost.

[4. Method for Manufacturing Compound Single Crystal (2)]

A method for manufacturing the compound single crystal according to the second embodiment of the invention is characterized in that the single crystal 32 including an inorganic compound is grown on the surface of the seed crystal 22 under a predetermined temperature condition using the apparatus 12 for manufacturing the compound single crystal according to the second embodiment of the invention.

[4.1. Metal Source]

As described above, in the case of using the crucible (stacked crucible) 72, the respective k-th crucible 72(k) may be filled with the same metal source or different metal sources. However, since the carrier gas flows from the lowermost first crucible 72(1) to the uppermost n-th crucible 72(n), if a lower crucible is filled with a metal source that is less likely to generate a metal-contained gas, a metal-contained gas may be liquified or solidified in an upper crucible.

It is therefore preferable to fill the lower crucible with an easily vaporizable metal source, and fill the upper crucible with a less vaporizable metal source.

For example, when each k-th metal source 74(k) ($1 \leq k \leq n$) includes only a metal, the boiling point of a (k+1)-th metal source 74(k+1) is preferably equal to or higher than the boiling point of the k-th metal source 74(k) to generate a predetermined amount of metal vapor from each k-th crucible 72(k).

Other points of the metal source are the same as those in the first embodiment, and description of them is omitted.

[4.2. Expressions (11) and (12): Temperature Control]

In the second embodiment, growth of the single crystal 32 is performed under a condition where the temperature of each section satisfies Expressions (11) and (12).

$$T_G < T_D \leq T_{Dmax} < T_{Sn} < T_B \quad (11)$$

$$T_{Sk} \leq T_{Sk+1} \ (1 \leq k \leq n-1) \quad (12)$$

where $T_G$ is a growth temperature, $T_{Sn}$ is the temperature of the n-th metal source packed in the n-th crucible, $T_D$ is the decomposition temperature of the inorganic compound, $T_{Dmax}$ is the maximum of the decomposition temperature of the inorganic compound generated from at least any one of metal elements contained in the first to n-th metal sources and the reactant gas, $T_{Sk}$ is the temperature of the k-th metal source packed in the k-th crucible, $T_{Sk+1}$ is the temperature of the (k+1)-th metal source packed in the (k+1)-th crucible, and $T_B$ is the temperature of the porous baffle plate provided in the opening of the n-th crucible.

Expression (11) represents a condition for smoothly generating the metal-contained gas from the crucible 72 and a condition for stably growing the single crystal 32 on the surface of the seed crystal 22. In Expression (11), $T_{Dmax} < T_{Sn}$ represents a condition for suppressing formation of an unintended inorganic compound (which is not necessarily the same as the inorganic compound constituting the single crystal 32) in the n-th crucible 72(n). Other parts of Expression (11) each have the same meaning as Expression (10).

Expression (12) represents a condition for smoothly generating the metal-contained gas from each of k-th crucibles 72(k). The carrier gas flows from the first crucible 72(1) to the n-th crucible 72(*n*). Hence, if the temperature of a (k+1)-th crucible 72(*k*+1) on a downstream side is lower than the temperature of a k-th crucible 72(*k*) on an upstream side, a metal-contained gas generated on the upstream side may be liquified or solidified. $T_{Sk} \leq T_{Sk+1}$ is therefore necessary.

[4.3. Other Configurations]

Other points of the method for manufacturing the compound single crystal according to the second embodiment are the same as those in the first embodiment, and description of them is omitted.

[5. Preferable Growth Condition]

Nitride single crystal is known as a typical compound that is difficult to grow in a form of single crystal. The following description shows a detailed growth condition for growth of a nitride single crystal using the invention.

[5.1. Preferable Growth Condition of GaN Single Crystal]

[5.1.1. Material]

It is preferable to use metal Ga as the metal source and $NH_3$ as the reactant gas to grow a GaN single crystal. Inert gas such as $N_2$ or Ar is preferable as the carrier gas (diluent gas) to transport the metal vapor and the reactant gas.

GaN or $Ga_2O_3$ may also be used as the metal source. However, GaN is gradually decomposed and varied in vaporization rate with the lapse of growth time, and thus supply of Ga vapor gradually becomes unstable. Using $Ga_2O_3$ increases oxygen impurities in the grown crystal and is thus unsuitable for increasing purity of the grown crystal. For intentional oxygen doping, however, an appropriate amount (1 to 20 mass %) of $Ga_2O_3$ may be added to metal Ga.

[5.1.2. Temperature of Metal Source]

The temperature $T_S$ of metal Ga preferably satisfies $1200°$ C.$<T_S<1350°$ C.

The temperature (decomposition temperature $T_D$), at which decomposition of GaN becomes conspicuous, is about $1200°$ C. Hence, if the temperature $T_S$ of metal Ga is equal to or lower than the decomposition temperature $T_D$, a slight amount of reactant gas contaminated in the crucible reacts with the metal Ga, and thus a passive film (slow vaporization rate film) is formed on the surface of the metal Ga, resulting in a decrease in growth rate. Hence, the temperature $T_S$ of metal Ga preferably satisfies $T_S>1200°$ C.

On the other hand, in the case of an excessively high temperature $T_S$ of metal Ga, when the mixed gas (metal vapor and carrier gas), which has passed through the porous baffle plate, joins with the reactant gas, decomposition of the reactant gas is excessively accelerated, and effective partial pressure of the reactant gas is excessively reduced on the growth surface. Hence, the temperature $T_S$ of metal Ga preferably satisfies $T_S<1350°$ C.

[5.1.3. Growth Temperature]

The growth temperature $T_G$ preferably satisfies $1000°$ C.$<T_G<1200°$ C.

An excessively low growth temperature (the temperature of the seed crystal surface or the grown-crystal surface) $T_G$ deteriorates crystal quality. Hence, the growth temperature $T_G$ preferably satisfies $T_G>1000°$ C.

On the other hand, an excessively high growth temperature $T_G$ decomposes the GaN crystal and causes formation of a Ga liquid film on the grown-crystal surface. Hence, $T_G$ preferably satisfies $T_G<1200°$ C.

[5.1.4. Temperature of Porous Baffle Plate]

The temperature $T_B$ of the porous baffle plate is necessary to exceed the temperature $T_S$ of the metal source. The temperature $T_B$ of the porous baffle plate particularly preferably satisfies $T_B \geq T_S+50°$ C. By adjusting the temperature $T_B$ of the porous baffle plate within such a range, it is possible to completely prevent Ga droplets or GaN polycrystals from adhering onto the porous baffle plate.

[5.2. Preferable Growth Condition of InN Single Crystal]

[5.2.1. Material]

It is preferable to use metal In as the metal source and $NH_3$ as the reactant gas to grow an InN single crystal. An inert gas such as $N_2$ or Ar is preferable as the carrier gas (diluent gas) to transport the metal vapor and the reactant gas.

InN or $In_2O_3$ may also be used as the metal source. However, InN is gradually decomposed and varied in vaporization rate with the lapse of growth time, and thus supply of In vapor gradually becomes unstable. Using $In_2O_3$ increases oxygen impurities in the grown crystal and is thus unsuitable for increasing purity of the grown crystal. For intentional oxygen doping, however, an appropriate amount (1 to 20 mass %) of $In_2O_3$ may be added to metal In.

[5.2.2. Temperature of Metal Source]

The temperature $T_S$ of metal In preferably satisfies $800°$ C.$<T_S<1000°$ C.

The temperature (decomposition temperature $T_D$), at which decomposition of InN becomes conspicuous, is about $800°$ C. Hence, if the temperature $T_S$ of metal In is equal to or lower than the decomposition temperature $T_D$, a slight amount of reactant gas contaminated in the crucible reacts with the metal In, and thus a passive film (slow vaporization rate film) is formed on the surface of the metal In, resulting in a decrease in growth rate. Hence, the temperature $T_S$ of metal In preferably satisfies $T_S>800°$ C.

On the other hand, in the case of an excessively high temperature $T_S$ of metal In, the mixed gas (metal vapor and carrier gas), which has passed through the porous baffle plate, increases the surface temperature of the grown crystal, and thus the surface temperature may be deviated from an appropriate temperature range. Hence, the temperature $T_S$ of metal In preferably satisfies $T_S<1000°$ C.

[5.2.3. Growth Temperature]

The growth temperature $T_G$ preferably satisfies $700°$ C.$<T_G<800°$ C.

An excessively low growth temperature (the temperature of the seed crystal surface or the grown-crystal surface) $T_G$ deteriorates crystal quality. Hence, the growth temperature $T_G$ preferably satisfies $T_G>700°$ C.

On the other hand, excessively high growth temperature $T_G$ decomposes the InN crystal and causes formation of an In liquid film on the grown-crystal surface. Hence, $T_G$ preferably satisfies $T_G<800°$ C.

[5.2.4. Temperature of Porous Baffle Plate]

The temperature $T_B$ of the porous baffle plate is necessary to exceed the temperature $T_S$ of the metal source. The temperature $T_B$ of the porous baffle plate particularly preferably satisfies $T_B \geq T_S+50°$ C. By adjusting the temperature $T_B$ of the porous baffle plate within such a range, it is possible to completely prevent In droplets or InN polycrystals from adhering onto the porous baffle plate.

[5.3. Preferable Growth Condition of AlN Single-Crystal]

[5.3.1. Material]

It is preferable to use metal Al as the metal source and $NH_3$ and $N_2$ as the reactant gas to grow an AlN single crystal. A noble gas such as Ar is preferable as the carrier gas (diluent gas) to transport the metal vapor and the reactant gas.

AlN or $Al_2O_3$ may also be used as the metal source. However, such a material is low in vaporization rate and is thus unsuitable for high-rate growth.

[5.3.2. Temperature of Metal Source]

The temperature $T_S$ of metal Al preferably satisfies 1500° C.<$T_S$<1800° C.

The temperature (decomposition temperature $T_D$), at which decomposition of AlN becomes conspicuous, is 1500 to 1520° C. Hence, if the temperature $T_S$ of metal Al is equal to or lower than the decomposition temperature $T_D$, a slight amount of reactant gas contaminated in the crucible reacts with the metal Al, and thus a passive film (slow vaporization rate film) is formed on the surface of the metal Al, resulting in a decrease in growth rate. Hence, the temperature $T_S$ of metal Al preferably satisfies $T_S$>1500° C.

On the other hand, an excessively high temperature $T_S$ of metal Al damages a furnace structural member (such as a quartz chamber) by radiant heat. Hence, the temperature $T_S$ of metal Al preferably satisfies $T_S$<1800° C.

[5.3.3. Growth Temperature]

The growth temperature $T_G$ preferably satisfies 1300° C.<$T_G$<1800° C.

An excessively low growth temperature (the temperature of the seed crystal surface or the grown-crystal surface) $T_G$ deteriorate crystal quality. Hence, the growth temperature $T_G$ preferably satisfies $T_G$>1300° C.

On the other hand, an excessively high growth temperature $T_G$ decreases the growth rate. Hence, $T_G$ preferably satisfies $T_G$<1800° C.

[5.3.4. Temperature of Porous Baffle Plate]

The temperature $T_B$ of the porous baffle plate is necessary to exceed the temperature $T_S$ of the metal source. The temperature $T_B$ of the porous baffle plate particularly preferably satisfies $T_B \geq T_S + 50°$ C. By adjusting the temperature $T_S$ of the porous baffle plate within such a range, it is possible to completely prevent Al droplets or AlN polycrystals from adhering onto the porous baffle plate.

[5.4. Preferable Growth Condition of InGaN Single Crystal]

[5.4.1. Material]

A stacked crucible is used for growth of an InGaN single crystal. It is preferable to use metal In as a first metal source, metal Ga as a second metal source, and $NH_3$ as the reactant gas. An inert gas such as $N_2$ or Ar is preferable as the carrier gas (diluent gas) to transport the metal vapor and the reactant gas.

[5.4.2. Temperature of Metal Source]

The temperature $T_{S1}$ of metal In preferably satisfies 800° C.<$T_{S1}$<1000° C. for the same reason as in [5.2.2.].

The temperature $T_{S2}$ of metal Ga preferably satisfies 1200° C.<$T_{S2}$<1350° C.

The temperature (decomposition temperature $T_{D2}$), at which decomposition of GaN becomes conspicuous, is about 1200° C., which is higher than the decomposition temperature $T_{D1}$ of InN and higher than the decomposition temperature $T_D$ of InGaN. Hence, if the temperature $T_{S2}$ of metal Ga is equal to or lower than the decomposition temperature $T_{D2}$, a slight amount of reactant gas contaminated in the crucible reacts with the metal Ga, and thus a passive film (slow vaporization rate film) is formed on the surface of the metal Ga, resulting in a decrease in growth rate. Hence, the temperature $T_{S2}$ of metal Ga preferably satisfies $T_{S2}$>1200° C.

On the other hand, in the case of an excessively high temperature $T_{S2}$ of metal Ga, when the mixed gas (metal vapor and carrier gas), which has passed through the porous baffle plate, joins with the reactant gas, decomposition of the reactant gas is excessively accelerated, and effective partial pressure of the reactant gas is excessively reduced on the growth surface. Hence, the temperature $T_{S2}$ of metal Ga preferably satisfies $T_{S2}$<1350° C.

[5.4.3. Growth Temperature]

The growth temperature $T_G$ preferably satisfies 700° C.<$T_G$<1200° C.

An excessively low growth temperature (the temperature of the seed crystal surface or the grown-crystal surface) $T_G$ deteriorates crystal quality. Hence, the growth temperature $T_G$ preferably satisfies $T_G$>700° C.

On the other hand, an excessively high growth temperature $T_G$ decomposes the crystal. Hence, $T_G$ preferably satisfies $T_G$<1200° C.

[5.5. Preferable Growth Condition of AlGaN Single Crystal]

[5.5.1. Material]

A stacked crucible is used for growth of an AlGaN single crystal. It is preferable to use metal Ga as a first metal source, metal Al as a second metal source, and $NH_3$ and $N_2$ as the reactant gas. A noble gas such as Ar is preferable as the carrier gas (diluent gas) to transport the metal vapor and the reactant gas.

[5.5.2. Temperature of Metal Source]

The temperature $T_{S1}$ of metal Ga preferably satisfies 1200° C.<$T_{S1}$<1350° C. for the same reason as in [5.1.2.].

The temperature $T_{S2}$ of metal Al preferably satisfies 1500° C.<$T_{S2}$<1800° C.

The temperature (decomposition temperature $T_{D2}$), at which decomposition of AlN becomes conspicuous, is about 1.500° C., which is higher than the decomposition temperature $T_{D1}$ of GaN and higher than the decomposition temperature $T_D$ of AlGaN. Hence, if the temperature $T_{S2}$ of metal Al is equal to or lower than the decomposition temperature $T_{D2}$, a slight amount of reactant gas contaminated in the crucible reacts with metal Al, and thus a passive film (slow vaporization rate film) is formed on the surface of the metal Al, resulting in a decrease in growth rate. Hence, the temperature $T_{S2}$ of metal Al preferably satisfies $T_{S2}$>1500° C.

On the other hand, an excessively high temperature $T_{S2}$ of metal Al damages a furnace structural member (such as a quartz chamber) by radiant heat. Hence, the temperature $T_{S2}$ of metal Al preferably satisfies $T_S$<1800° C.

[5.5.3. Growth Temperature]

The growth temperature $T_G$ preferably satisfies 1000° C.<$T_G$<1500° C.

An excessively low growth temperature (the temperature of the seed crystal surface or the grown-crystal surface) $T_G$ deteriorates crystal quality. Hence, the growth temperature $T_G$ preferably satisfies $T_G$>1000° C.

On the other hand, an excessively high growth temperature $T_G$ decomposes the crystal. Hence, $T_G$ preferably satisfies $T_G$<1500° C.

[5.6. $NH_3$ Partial Pressure]

When $NH_3$ is used as the reactant gas for growth of the nitride single crystal, partial pressure $P_{NH3}$ of $NH_3$ in growth atmosphere preferably satisfies 0.1 kPa<$P_{NH3}$<1 kPa. Excessively low partial pressure $P_{NH3}$ of $NH_3$ causes condensation of the metal-contained gas and formation of a liquid film on the grown-crystal surface. Hence, $P_{NH3}$ preferably satisfies $P_{NH3}$>0.1 kPa.

On the other hand, excessively high $P_{NH3}$ causes a reaction of the metal-contained gas with $NH_3$ in a vapor phase, which increases a possibility of formation of nitride powder. The nitride powder formed in the vapor phase may cause contamination of particles into the grown crystal. Hence, $P_{NH3}$ preferably satisfies $P_{NH3}$<1 kPa.

[6. GaN Single Crystal]

The GaN single crystal according to the invention has a C impurity amount of less than $8 \times 10^{15}$ cm$^{-3}$, an H impurity amount of less than $3 \times 10^{16}$ cm$^{-3}$, and an O impurity amount of less than $6\times10^{15}$ cm$^{-3}$. The term "impurity" means a value measured using a secondary ion mass spectrometry.

As described above, in the case of growing the GaN single crystal using the apparatus according to the invention, optimizing the porous baffle plate 48 and the crucible 42 makes it possible to grow a single crystal having higher quality than before at a growth rate equal to or higher than before. This is probably because:

(a) optimizing the structure of the porous baffle plate 48 makes it possible to suppress a decrease in temperature of the porous baffle plate 48 without decreasing the growth rate; and (b) optimizing the material of the crucible 42 suppresses creep-up of liquid Ga on a wall surface of the crucible during crystal growth.

[7. Effects]

Figure 5:
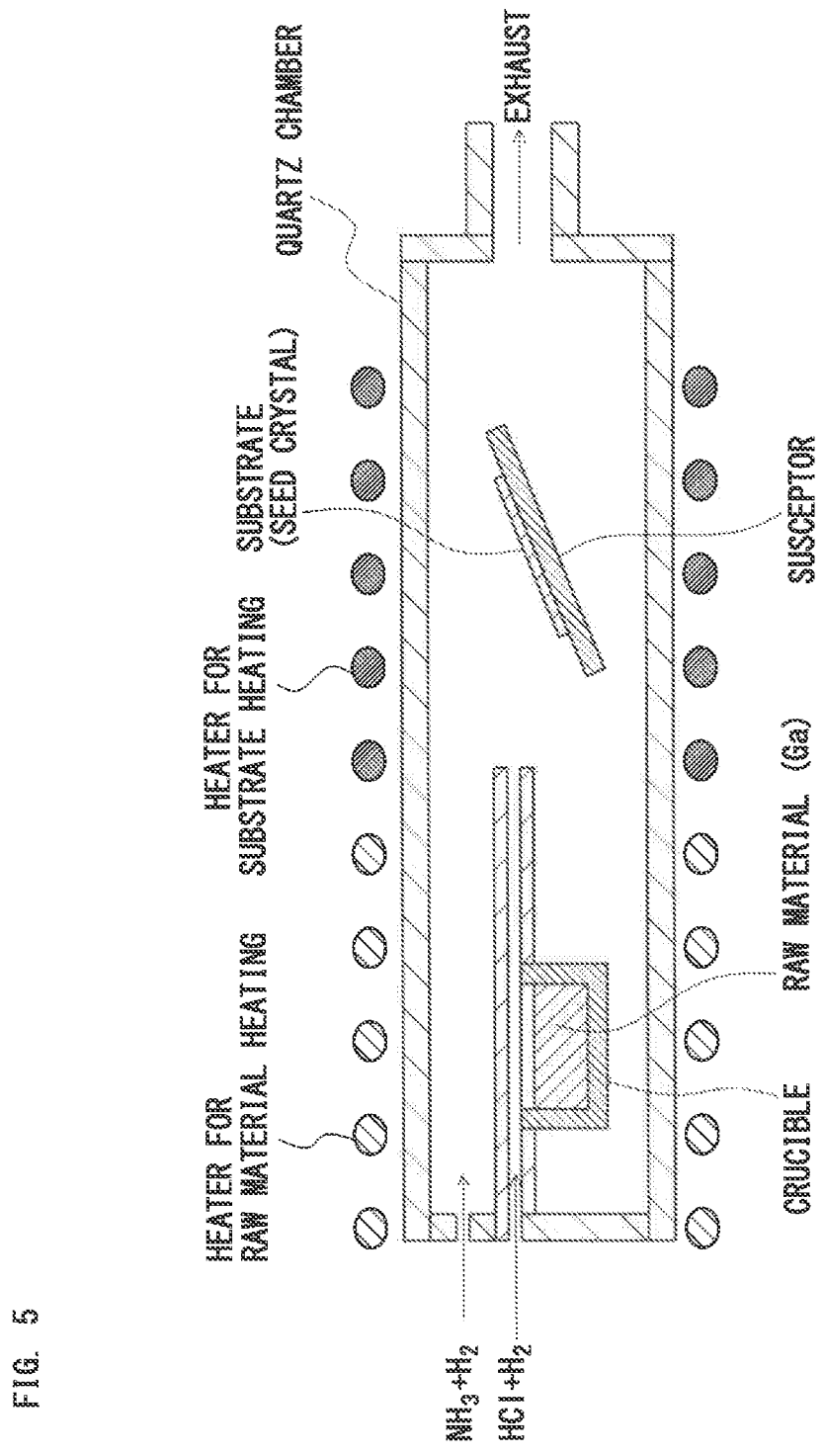
FIG. 5 is a schematic sectional diagram to explain a hydride vapor phase epitaxy (HVPE) method.

A hydride vapor phase epitaxy (HVPE) method is typically used to produce a bulk nitride single crystal (growth height: about 10 mm or less) (see FIG. 5). The HVPE method easily achieves a growth rate of about 100 μm/h. However, since an HCl gas is used to transport a group III element, and ammonia is used as a material of a group IV element, ammonium chloride is formed as a byproduct. The ammonium chloride causes clogging of an exhaust pipe. The HVPE method is therefore unsuitable for prolonged growth.

Figure 6:
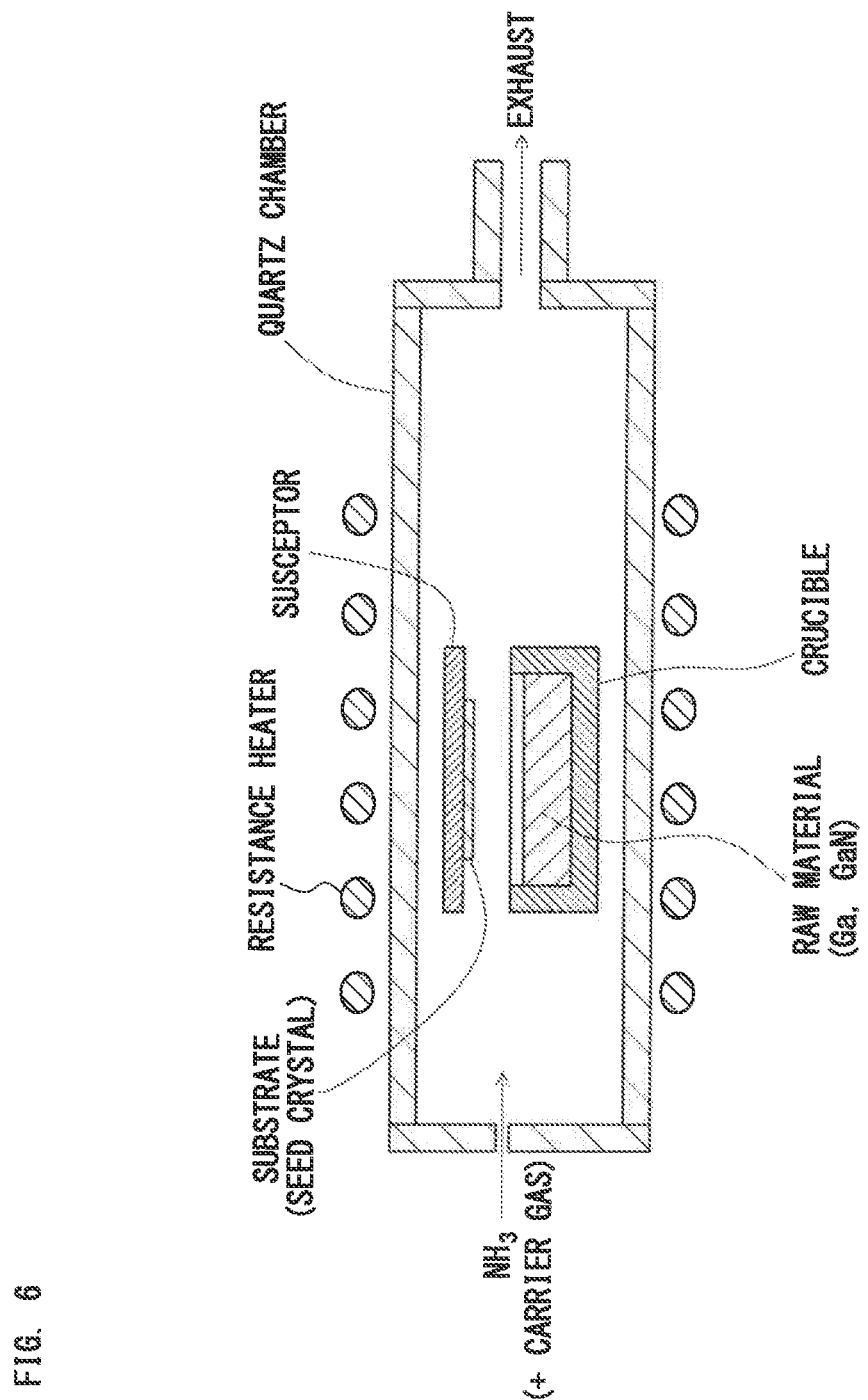
FIG. 6 is a schematic sectional diagram to explain an existing vapor phase epitaxy method without using halogen.

In a vapor phase epitaxy method without using halogen, GaN crystal is grown while metal Ga or powder of GaN is used as a raw material, and NH$_3$ is used as the reactant gas (see FIG. 6). For the vapor phase epitaxy method without using halogen, although it has been reported that high-rate growth similar to that by the HVPE method can be performed, there has been no report that a large crystal exceeding 1 mm thick is produced.

This is because when only GaN is used as the raw material, since GaN is gradually decomposed and changed into metal Ga with the lapse of growth time, raw material supply is ceased during growth.

In the vapor phase epitaxy method without using halogen, when metal Ga is used as the raw material, Ga spills out of the crucible during growth and covers the apparatus as a whole. The reason for such spilling of Ga is because GaN precipitates on the surface of the crucible holding the metal Ga. Since molten Ga greatly wets on GaN, when GaN precipitates on the crucible surface, molten Ga easily creeps up. Hence, there has been no case where GaN crystal is stably grown using metal Ga for a long time of 2 hours or more.

Furthermore, the Ga yield in such methods is probably extremely small (about 15%) although it has not been reported.

On the other hand, there is known a method, in which gallium hydride generated by a reaction of metal Ga and hydrogen is used as a precursor. However, since GaN crystal is etched by the hydrogen, the growth rate is limited to less than 100 μm/h.

Furthermore, to achieve good crystal growth using the vapor phase epitaxy method without using halogen as described later, it is necessary that the metal vapor or the sublimated gas reaches a growth surface in an atomic or molecular state and is reacted with the reactant gas on the growth surface. However, it is in general difficult to stably grow a bulk single crystal in such a method. The major reasons for this are probably as follows:

(a) compound powder is formed in a vapor phase by a vapor phase reaction;

(b) metal is liquified or solidified in a vapor phase, on a growing crystal surface, or on another structural component, and (c) a passive film is formed on the surface of the metal source through a direct reaction of the reactant gas with the metal source in the crucible, or a bumping phenomenon occurs through a drastic reaction so that supply of the metal vapor or the sublimated gas becomes unstable.

On the other hand, in a case of crystal growth using the vapor phase epitaxy method without using halogen according to the invention, the porous baffle plate is provided in the opening of the crucible filled with the metal source, and the carrier gas is flowed into the crucible, and thus the mixed gas is discharged from the crucible while backflow of the reactant gas into the crucible is suppressed. This stabilizes supply of the metal-contained gas.

In growth of the single crystal, optimizing the temperature of each section makes it possible to suppress formation of the compound powder in the vapor phase, or suppress liquidation or solidification of the metal at an unintended site. It is therefore possible to reduce manufacturing cost of the compound single crystal or increase crystal size.

Furthermore, optimizing a shape of the porous baffle plate makes it possible to stably grow the crystal even if the outlet gas flow rate is less than 20 m/sec. In addition, optimizing relative density or average pore size of the crucible makes it possible to prevent a liquid metal from creeping up a crucible wall surface when the liquid metal is used as the metal source. Use of such an apparatus provides a GaN single crystal having extremely low concentrations of C, H, and O impurities.

EXAMPLES

Example 1: Creep-Up Height

[1. Test Method]

Creep-up height of liquid Ga was measured using a crucible having an average pore size of about 10 μm. The creep-up height (h) was calculated using Expression (4).

[2. Results]

Figure 7:
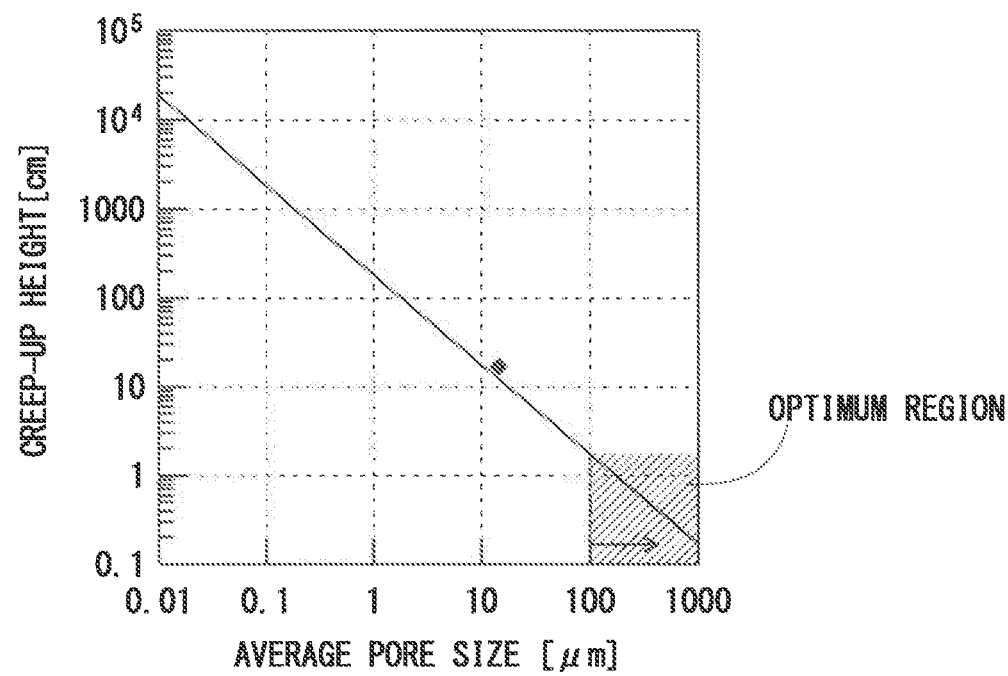
FIG. 7 is a graph showing dependence of average pore size on creep-up height of Ga.

FIG. 7 shows dependence of the average pore size on Ga creep-up height. FIG. 7 reveals that the average pore size may be set to one hundred micrometers or more to adjust the creep-up height (h) to several centimeters or less.

Examples 2 to 4, Comparative Examples 1 and 2: Volume Ratio

[1. Sample Preparation]

A GaN single crystal was grown using the apparatus shown in FIG. 1. Metal Ga was used as the metal source, and NH$_3$ was used as the reactant gas. A sapphire template with an MOCVD-GaN film (2 μm thick) having a diameter of 2 in. (5.08 cm) was used as the seed crystal. N$_2$ was used as the carrier gas to transport Ga vapor and as the diluent gas (carrier gas) for NH$_3$. A porous baffle plate having a diameter of 15 mm (Comparative Example 1), 20 mm (Comparative Example 2), 30 mm (Example 2), 40 mm (Example 3), or 50 mm (Example 4) was used as the porous baffle plate 48. In each porous baffle plate 48, 45 cylindrical through-holes each having a diameter of 2 mm and a length of 4 mm were formed. Crystal was grown for 1 hour while a growth condition was adjusted to secure a crucible outlet gas-flow-rate of 0.9 m/sec.

[2. Test Method and Results]

Figure 8:
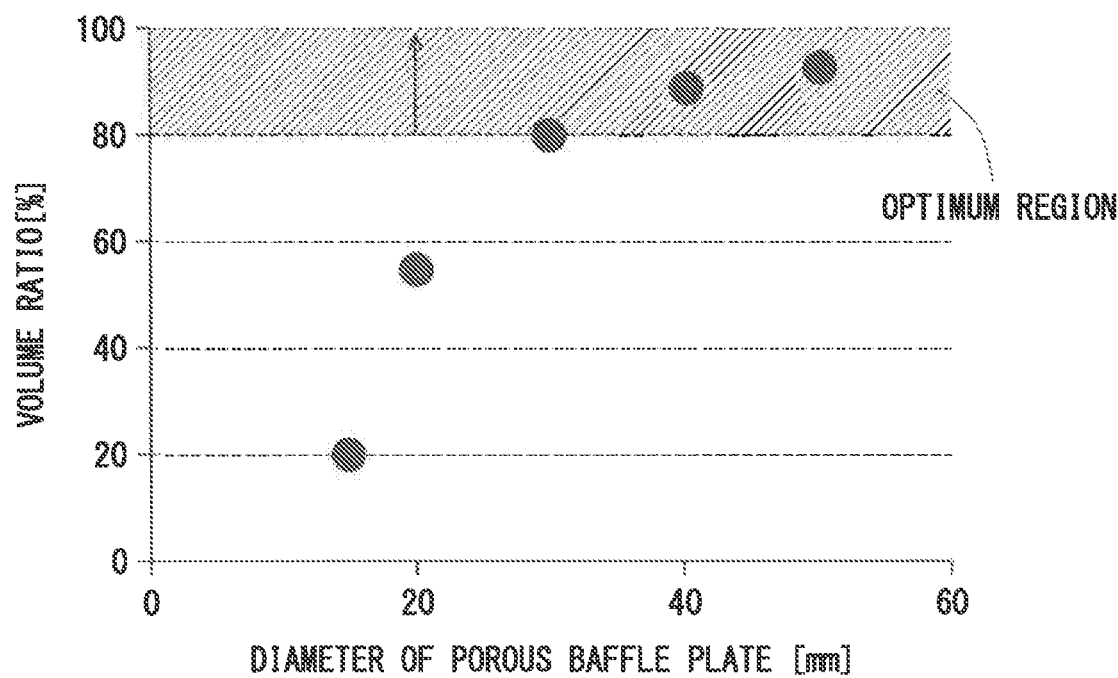
FIG. 8 is a graph showing a relationship between diameter and a volume ratio $((1-V_H/V_B)\times 100)$ of a porous baffle plate.

A surface condition of the resultant GaN single crystal was visually evaluated. Particle contamination density in the grown crystal was measured using an optical microscope. Table 1 shows the results. FIG. 8 shows a relationship between diameter and a volume ratio $(1-V_H/V_B)\times 100$ of the porous baffle plate.

TABLE 1

|  | Comparative Example 1 | Comparative Example 2 | Example 2 | Example 3 | Example 4 |
| --- | --- | --- | --- | --- | --- |
| Diameter of porous baffle plate [mm] | 15 | 20 | 30 | 40 | 50 |
| Volume ratio (1 − vb/vh)*100[%] | 20 | 55 | 88 | 88.75 | 92.8 |
| Visual observation results of grown crystal | Formation of Ga droplets | Partial formation of Ga droplets | Good (no formation of Ga droplets) | Good (no formation of Ga droplets) | Good (no formation of Ga droplets) |
| Visual observation results of $NH_3$ contamination into crucible | Contamination occurs | Contamination occurs | No contamination occurs | No contamination occurs | No contamination occurs |
| Determination result* | x | Δ | ○ | ○ | ○ |

*○: Optimum growth condition,

Δ: Droplet formation or growth rate slowdown, x: Inappropriate

Visual observation results suggest that no Ga droplet exists on any of the surfaces of the GaN grown crystals of the Examples 2 to 4, i.e., each GaN grown crystal has a smooth mirror surface, showing good crystal quality. On the other hand, Ga droplets were formed on the respective surfaces of the grown crystals of the Comparative Examples 1 and 2. This is probably because:

(a) Ga vapor was cooled while passing through the porous baffle plate 48, resulting in formation of Ga droplets; and (b) liquid Ga was bumped due to contamination of $NH_3$ gas into the crucible 42.

A porous baffle plate 48 having a small volume ratio has a small heat capacity. The Ga vapor is therefore considered to be cooled due to the decreased temperature of the porous baffle plate 48 by gas. Alternatively, it is considered that since the porous baffle plate 48 has a low temperature, the $NH_3$ gas passes through the porous baffle plate 48 while being not decomposed, and reaches the liquid Ga in the crucible 42. These results showed that the volume ratio of the porous baffle plate 48 was preferably 80% or more.

Examples 5 to 9: Crucible Outlet Gas-Flow-Rate

[1. Sample Preparation]

A GaN single crystal was produced in the same way as in the Example 2 except that the crucible outlet gas-flow-rate was 0.3 to 15 m/sec. A porous baffle plate having a diameter: 40 mm, through-hole size: 2 mm in diameter and 4 mm in length, the number of through-holes: 45, and a volume ratio: 88.75% was used as the porous baffle plate 48.

[2. Test Method and Results]

Figure 9:
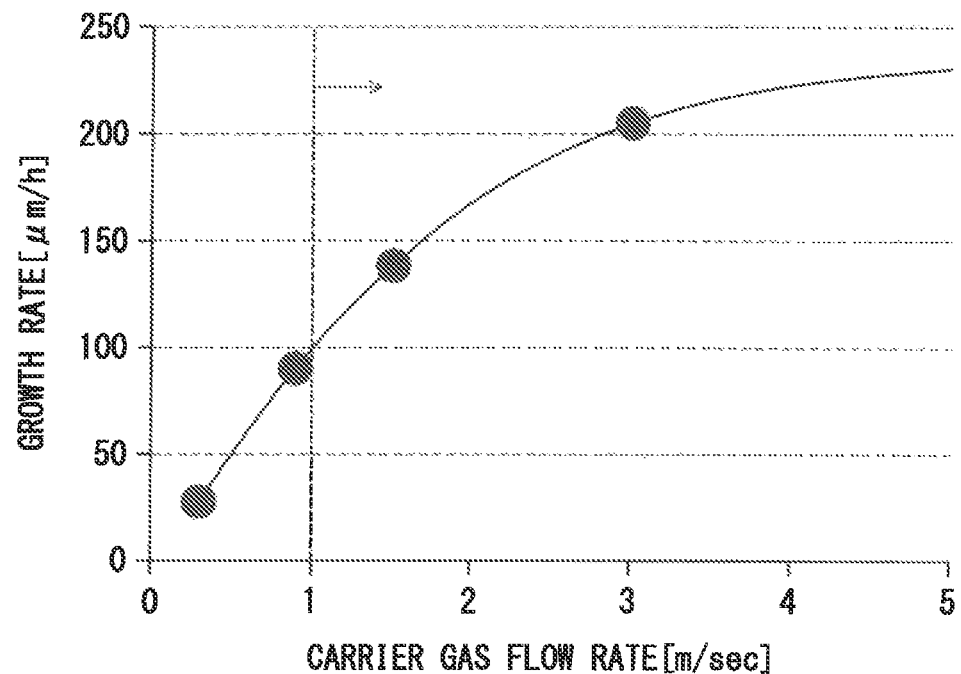
FIG. 9 is a graph showing dependence of carrier-gas flow rate on GaN growth rate.

A surface condition of the resultant GaN single crystal was visually evaluated. The growth rate of each single crystal was calculated. Table 2 shows the results. FIG. 9 shows dependence of carrier-gas flow rate on GaN growth rate.

TABLE 2

|  | Example 5 | Example 6 | Example 7 | Example 8 | Example 9 |
| --- | --- | --- | --- | --- | --- |
| Crucible outlet gas-flow-rate [m/sec] | 0.3 | 0.88 | 1.5 | 3 | 15 |
| Growth rate [μm/h] | 28 | 89 | 138 | 205 | 248 |
| Visual observation results of $NH_3$ contamination into crucible | No contamination occurs | No contamination occurs | No contamination occurs | No contamination occurs | No contamination occurs |
| Determination result* | Δ | Δ | ○ | ○ | ○ |

*○: Optimum growth condition,

Δ: Droplet formation or growth rate slowdown, x: Inappropriate

Contamination of NH$_3$ into the crucible 42 was not found at any condition. However, the supply amount of the Ga vapor decreased with a decrease in crucible outlet gas-flow-rate. The growth rate was less than 100 μm/h at the crucible outlet gas-flow-rate of less than 1 m/sec. Taking manufacturing efficiency into consideration, the growth rate is preferably 100 μm/h or more. These results teach that the crucible outlet gas-flow-rate is preferably 1 m/sec or more.

Example 10: a$^2$/L Ratio

[1. Test Method]
Porous baffle plates 48 having different a$^2$/L ratios were produced to examine a relationship between the a$^2$/L ratio and the crucible outlet gas-flow-rate. Temperature of each porous baffle plate 48 was 1300° C., and process pressure was 4 kPa.
[2. Results]
FIG. 10 shows dependence of a$^2$/L ratio on the crucible outlet gas-flow-rate. FIG. 10 reveals that when the a$^2$/L ratio of the porous baffle plate 48 is within a range of 0.0003<a$^2$/L<1.1, the crucible outlet gas-flow-rate is 1 m/sec or more.

Example 11: S$_B$/S$_L$ Ratio

Figure 11:
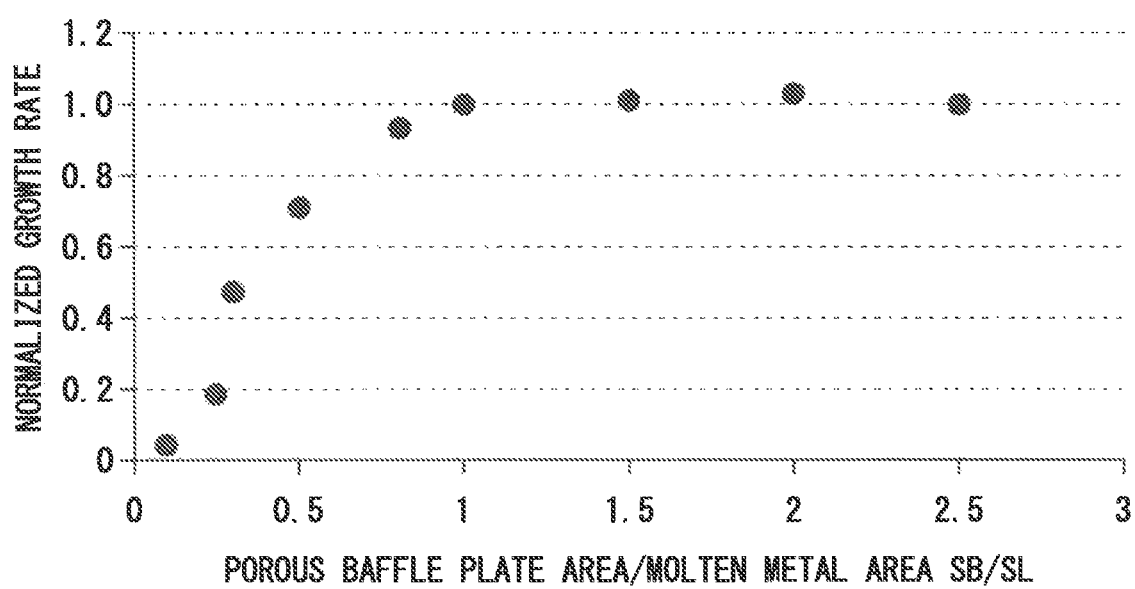
FIG. 11 is a graph showing dependence of $S_B/S_L$ ratio on normalized growth rate.

[1. Test Method]
A GaN single crystal was grown under conditions of different S$_B$/S$_L$ ratios. Other conditions were the same as those in the Example 2.
[2. Results]
FIG. 11 shows dependence of the S$_B$/S$_L$ ratio on normalized growth rate. The term "normalized growth rate" means a value obtained by normalizing the growth rate under each condition with respect to a growth rate at S$_B$/S$_L$=1. FIG. 11 reveals that the normalized growth rate is drastically reduced to less than 0.05 at the S$_B$/S$_L$ ratio of less than 0.1. These results showed that the S$_B$/S$_L$ ratio was preferably 0.1 or more.

Example 12, Comparative Example 3: GaN Single Crystal

[1. Sample Preparation]
A GaN single crystal was grown under the same condition as in the Example 9 (Example 12).
Another GaN single crystal was grown for comparison under a condition where the outlet carrier-gas flow rate was higher (73.8 m/sec) than in the Example 9 (Comparative Example 3).
[2. Test Method and Results]
Impurities contained in the GaN single crystal were measured by a secondary ion mass spectrometry. Table 3 shows the results. As shown in Table 3, the respective amounts of the C, H, and O impurities were less than 8×10$^{15}$ cm$^{-3}$ (equal to or lower than the background level) for C, less than 3×10$^{15}$ cm$^{-3}$ (equal to or lower than the background level) for H, and less than 6×10$^{15}$ cm$^{-3}$ (equal to or lower than the background level) for O.
Such a GaN single crystal in which the C, H, and O impurities had an amount equal to or lower than the background level has not been produced by the traditionally used HVPE method or MOCVD method. This is probably because the method of the invention can suppress creep-up of Ga and thus suppress the impurities from being trapped into the raw material Ga, or because the method decreases the outlet carrier-gas flow rate and thus extremely decreases the C, H, and O impurity concentrations derived from apparatus members or the like.

TABLE 3

| | C impurity [cm$^{-3}$] | H impurity [cm$^{-3}$] | O impurity [cm$^{-3}$] |
|---|---|---|---|
| Comparative Example 3 | — | — | 3 × 10$^{16}$ |
| Example 12 | <8 × 10$^{15}$ | <3 × 10$^{16}$ | <6 × 10$^{15}$ |

Although some embodiments of the invention have been described in detail hereinbefore, the invention should not be limited thereto, and various modifications or alterations thereof may be made within the scope without departing from the gist of the invention.

The apparatus for manufacturing compound single crystal according to the invention can be used as an apparatus to manufacture nitride single crystals such as GaN, InN, AlN, InGaN, and AlGaN.

What is claimed is:

1. An apparatus for manufacturing compound single crystal, comprising:
a crystal growth section having a susceptor to hold a seed crystal;
a gas supply section to supply a metal-contained gas (gas containing a metal vapor) generated from a metal source and a reactant gas, the reactant gas reacting with the metal-contained gas to form an inorganic compound, toward the seed crystal; and
a heating section having a heating unit to heat the seed crystal and the metal source,
wherein the gas supply section includes
a crucible disposed separately from the susceptor and holding the metal source,
a carrier gas supply unit that supplies a carrier gas into the crucible, and supplies a mixed gas of the metal-contained gas and the carrier gas toward the seed crystal, and
a reactant gas supply unit to supply the reactant gas toward the seed crystal,
a porous baffle plate is provided in an opening of the crucible, and
the porous baffle plate satisfies Expressions (1) and (2), $$80\% \leq (1-V_H/V_B) \times 100 \leq 92.8\% \quad (1)$$

$$0.0003 \text{ mm} < a^2/L \leq 1.0 \text{ mm} \quad (2)$$

where
V$_B$ is an apparent volume of the porous baffle plate,
V$_H$ is a total volume of through-holes contained in the porous baffle plate,
"a" is a diameter of the through-hole, and
L is a length of the through-hole.
2. The apparatus according to claim 1, wherein the through-hole has a portion having a different diameter along a thickness direction of the porous baffle plate.
3. The apparatus according to claim 1, wherein a ratio (S$_B$/S$_L$) of area (S$_B$) of the porous baffle plate to surface area (S$_L$) of the metal source held in the crucible is 0.1 or more.
4. The apparatus according to claim 1, wherein the crucible is one of a crucible having a relative density of 99% or more and a crucible having an average pore size of 100 μm or more.

5. The apparatus according to claim 1, further comprising:
a first movable unit to change one of a vertical distance and a horizontal distance between the porous baffle plate and the susceptor; and/or
a second movable unit to change one of a vertical distance and a horizontal distance between the heating unit and the crucible.

6. The apparatus according to claim 5,
wherein the susceptor is disposed above the crucible,
the first movable unit is capable of vertically moving the susceptor, and
the second movable unit is capable of vertically moving the heating unit.

7. The apparatus according to claim 1,
wherein the crucible includes
(a) an inner crucible to hold the metal source, and an outer crucible to accommodate the inner crucible,
(b) a carrier gas channel, the carrier gas channel provided between an outer wall surface of the inner crucible and an inner wall surface of the outer crucible so as to flow the carrier gas toward an inside of the inner crucible, and
(c) a carrier gas inlet provided in one of a bottom surface and a side surface of the outer crucible so as to introduce the carrier gas into the carrier gas channel.

8. The apparatus according to claim 7,
wherein the carrier gas channel is capable of flowing the carrier gas toward a top of the inner crucible, and
a carrier-gas flow direction adjuster is provided in an upper part of the outer crucible to change a direction of flow of the carrier gas to a direction toward the metal source after the carrier gas flow has reached the top of the inner crucible.

9. The apparatus according to claim 1,
wherein the reactant gas supply unit has a reactant-gas-flow direction adjuster provided between the susceptor and the crucible, and
the reactant-gas-flow direction adjuster changes a direction of flow of the reactant gas to a direction toward the mixed gas to promote mixing of the mixed gas and the reactant gas.

10. The apparatus according to claim 1, further comprising an angle changing unit that changes a tilt angle of a surface of the seed crystal.

11. The apparatus according to claim 7,
wherein the crucible is a stacked crucible including a first crucible, a second crucible, . . . , and an n-th crucible (n≥2) stacked upward in this order, the opening of a k-th crucible (1≤k≤n−1) being coupled to the carrier gas inlet of a (k+1)-th crucible, and
the porous baffle plate is provided at least in an opening of the uppermost n-th crucible.

12. A method for manufacturing a compound single crystal, wherein the apparatus for manufacturing compound single crystal according to claim 1 is used to grow a single crystal including the inorganic compound on a surface of the seed crystal under a condition where a temperature of each section satisfies Expression (10), $$T_G < T_D < T_S < T_B \tag{10}$$

where
$T_G$ is a growth temperature,
$T_S$ is a temperature of the metal source,
$T_D$ is a decomposition temperature of the inorganic compound, and
$T_B$ is a temperature of the porous baffle plate provided in the opening of the crucible.

13. A method for manufacturing a compound single crystal, wherein the apparatus for manufacturing compound single crystal according to claim 11 is used to grow a single crystal including the inorganic compound on a surface of the seed crystal under a condition where a temperature of each section satisfies Expressions (11) and (12), $$T_G < T_D \leq T_{Dmax} < T_{Sn} < T_B \tag{11}$$

$$T_{SK} \leq T_{SK+1} \; (1 \leq k \leq n-1) \tag{12}$$

where
$T_G$ is a growth temperature,
$T_{Sa}$ is a temperature of an n-th metal source packed in the n-th crucible,
$T_D$ is a decomposition temperature of the inorganic compound,
$T_{Dmax}$ is a maximum of the decomposition temperature of the inorganic compound generated from any one of the metal elements contained in the first to n-th metal sources and the reactant gas,
$T_{Sk}$ is a temperature of a k-th metal source packed in the k-th crucible,
$T_{Sk+1}$ is a temperature of a (k+1)-th metal source packed in the (k+1)-th crucible, and
$T_B$ is a temperature of the porous baffle plate provided in the opening of the n-th crucible.

14. The method according to claim 13,
wherein each k-th metal source (1≤k≤n) includes only a metal, and
a boiling point of the (k+1)-th metal source is equal to or higher than a boiling point of the k-th metal source.

15. The method according to claim 12 or 13, wherein the carrier gas is supplied such that a flow rate (crucible outlet gas-flow-rate) of the mixed gas passing through the porous baffle plate is 1 m/sec or higher and lower than 20 m/sec.

16. The method according to claim 12 or 13, wherein a single crystal is grown such that growth pressure P satisfies Expression (3), and a distance D between the porous baffle plate and the grown crystal satisfies Expression (4), $$0.1 \text{ kPa} < P < 6 \text{ kPa} \tag{3}$$

$$0.5 \text{ cm} \leq D < 5 \text{ cm} \tag{4}$$

17. The method according to claim 12 or 13,
wherein the metal source includes at least one metal element selected from a group consisting of Al, Ga, In, Zn, Cd, Hg, Si, Ge, Sn, Mg, Mn, Cu, and Ag, and
the reactant gas contains at least any one element selected from a group consisting of C, B, N, P, As, Sb, O, S, Se, and Te.

* * * * *